United States Patent
Darwish et al.

(10) Patent No.: US 9,263,573 B2
(45) Date of Patent: *Feb. 16, 2016

(54) POWER SEMICONDUCTOR DEVICES, STRUCTURES, AND RELATED METHODS

(71) Applicant: MaxPower Semiconductor, Inc., San Jose, CA (US)

(72) Inventors: Mohamed N. Darwish, Campbell, CA (US); Jun Zeng, Torrance, CA (US); Richard A. Blanchard, Los Altos, CA (US)

(73) Assignee: MAXPOWER SEMICONDUCTOR INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/523,492

(22) Filed: Oct. 24, 2014

(65) Prior Publication Data

US 2015/0108565 A1   Apr. 23, 2015

Related U.S. Application Data

(63) Continuation of application No. 13/770,011, filed on Feb. 19, 2013, now Pat. No. 8,890,238, which is a continuation of application No. 13/175,975, filed on Jul. 5, 2011, now Pat. No. 8,390,060.

(60) Provisional application No. 61/494,205, filed on Jun. 7, 2011, provisional application No. 61/361,540, filed on Jul. 6, 2010.

(51) Int. Cl.
*H01L 29/78* (2006.01)
*H01L 29/06* (2006.01)
(Continued)

(52) U.S. Cl.
CPC ........ *H01L 29/7813* (2013.01); *H01L 29/0634* (2013.01); *H01L 29/408* (2013.01); *H01L 29/66727* (2013.01); *H01L 29/66734* (2013.01); *H01L 29/7393* (2013.01); *H01L 29/7397* (2013.01); *H01L 29/7802* (2013.01); *H01L 29/7816* (2013.01); *H01L 21/26586* (2013.01); *H01L 29/0873* (2013.01); *H01L 29/0878* (2013.01); *H01L 29/1095* (2013.01); *H01L 29/402* (2013.01); *H01L 29/407* (2013.01); *H01L 29/41766* (2013.01); *H01L 29/42368* (2013.01)

(58) Field of Classification Search
CPC .......... H01L 29/0873; H01L 29/0882; H01L 29/0886; H01L 29/1045; H01L 29/408; H01L 29/66666; H01L 29/7827; H01L 21/26586; H01L 21/265
USPC ................. 257/334, 329, 336, 41, 342, 351
See application file for complete search history.

(56) References Cited

U.S. PATENT DOCUMENTS 5,374,569 A * 12/1994 Yilmaz et al. ............. 438/203
8,564,057 B1 * 10/2013 Darwish ............ H01L 29/408
257/244

(Continued)

*Primary Examiner* — Marc Armand
*Assistant Examiner* — Christina Sylvia
(74) *Attorney, Agent, or Firm* — Groover & Associates PLLC; Robert Groover; Gwendolyn Groover

(57) ABSTRACT

Power semiconductor devices, and related methods, where majority carrier flow is divided into paralleled flows through two drift regions of opposite conductivity types.

18 Claims, 34 Drawing Sheets

(51) Int. Cl.
  *H01L 29/66* (2006.01)
  *H01L 29/739* (2006.01)
  *H01L 21/265* (2006.01)
  *H01L 29/08* (2006.01)
  *H01L 29/10* (2006.01)
  *H01L 29/40* (2006.01)
  *H01L 29/417* (2006.01)
  *H01L 29/423* (2006.01)

(56) References Cited

U.S. PATENT DOCUMENTS

2004/0108551 A1* 6/2004 Kitamura et al. ............. 257/342
2010/0327344 A1* 12/2010 Paul et al. ..................... 257/330
2012/0098055 A1* 4/2012 Darwish ............. H01L 29/7816
                                                      257/330

* cited by examiner

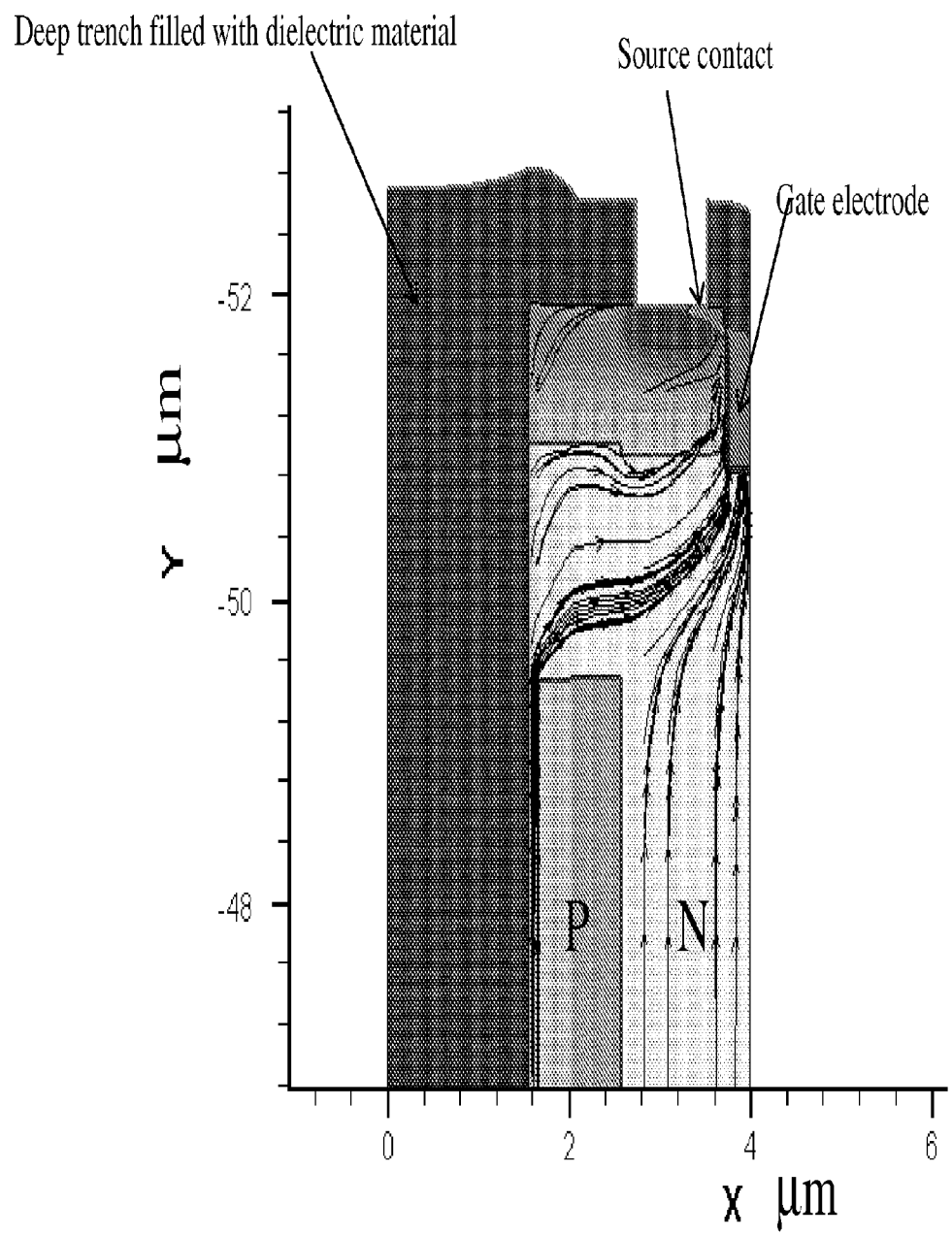
Figure 1C: Current flowlines of a transistor like that of Figure 1A.

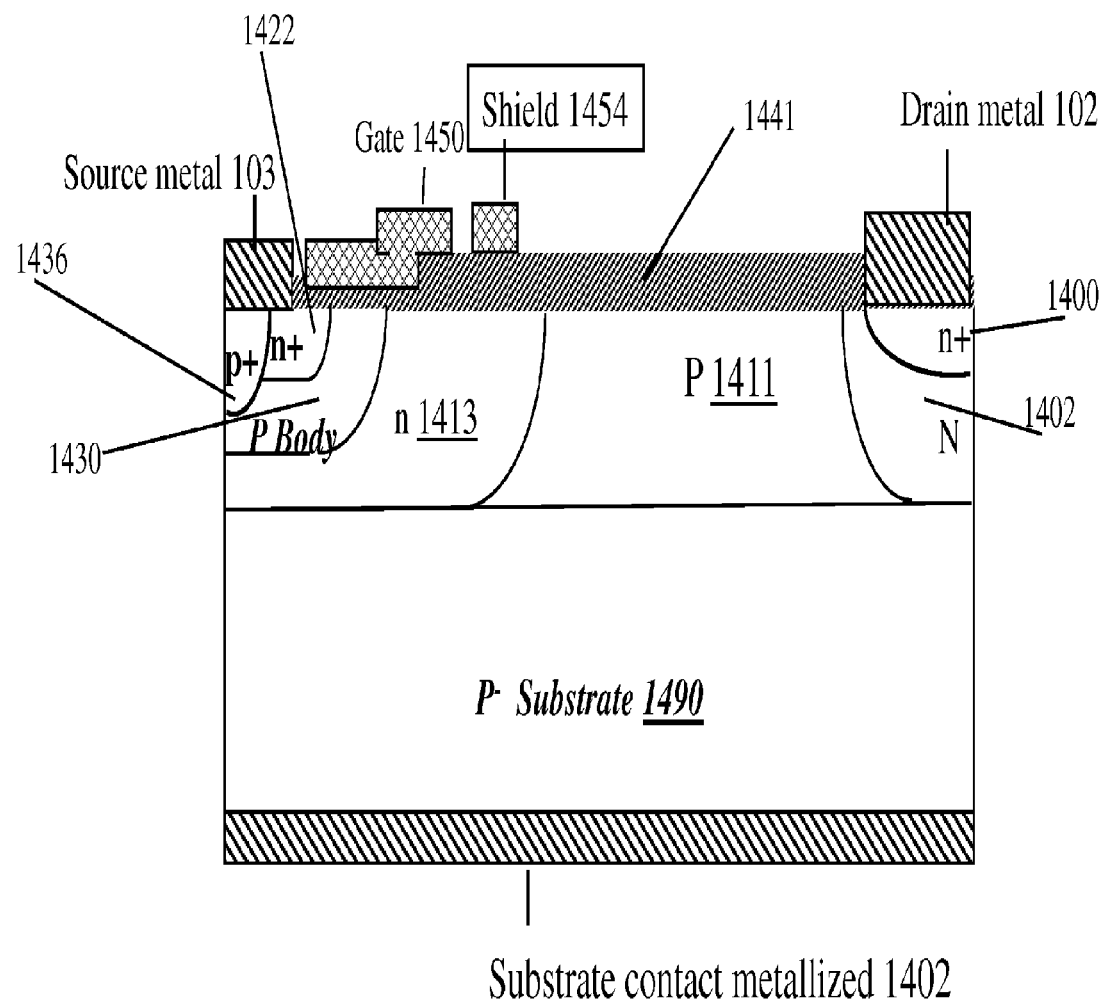
Figure 14B: A cross section along AA of the device shown in Figure 14A

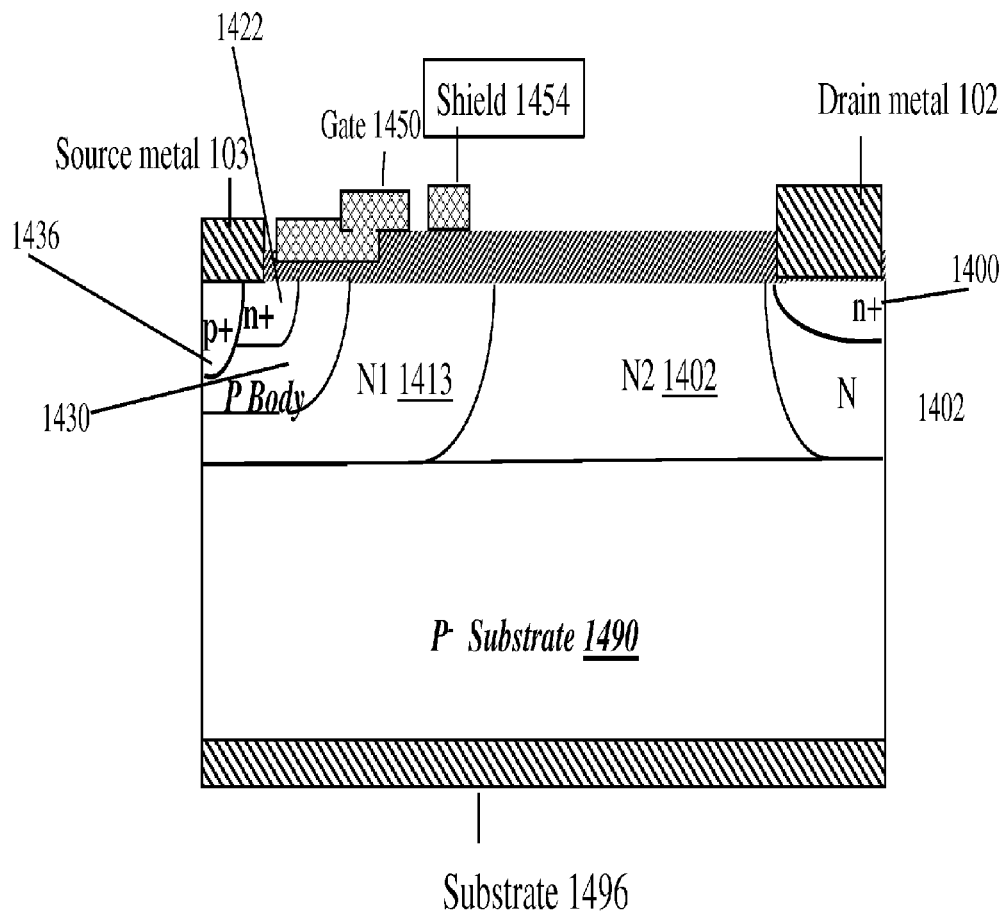
Figure 14C: A cross section along CC of the device shown in Figure 14A

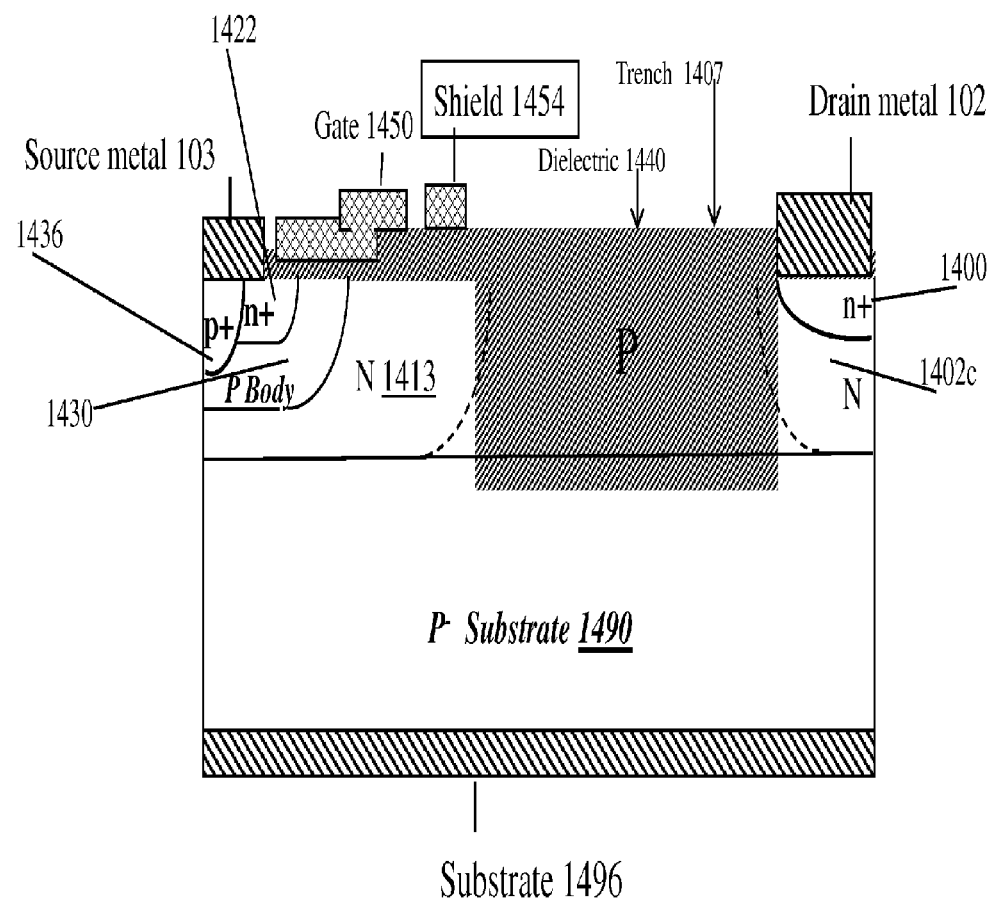
Figure 14D: Another version: cross section along BB of the device shown in Figure 14A

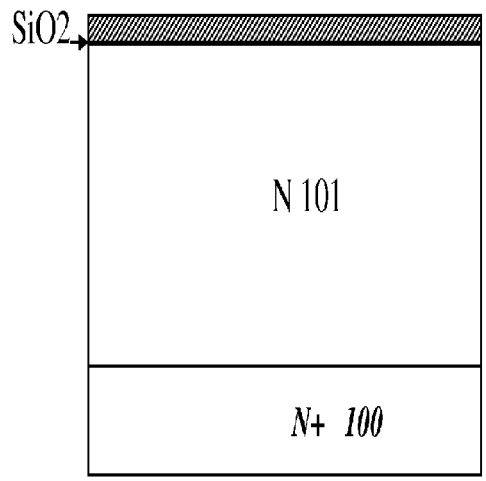
A N-Epi (option1), grow/depoit mask oxide
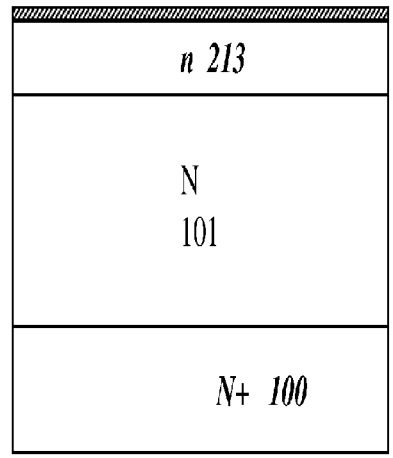
B Implant and drive n-drain region (optional)
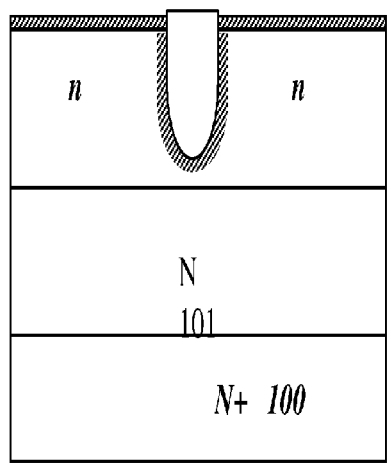
C Etch shallow gate trench and grow gate oxide
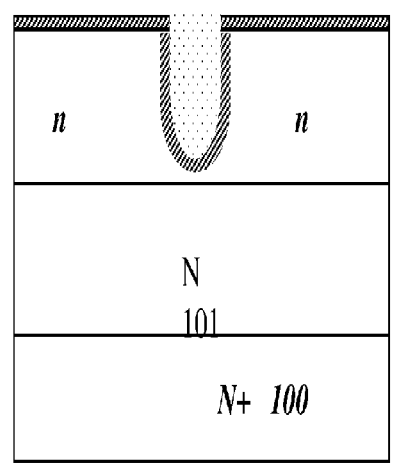
D Deposit and etch back polysilicon
Figure 15 A-D

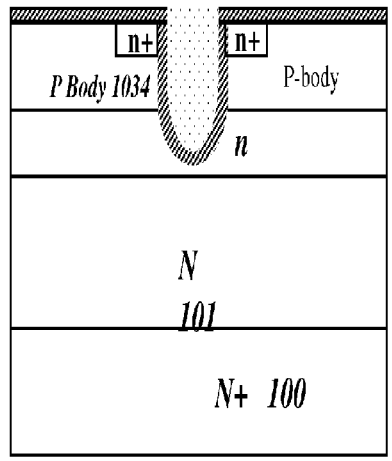
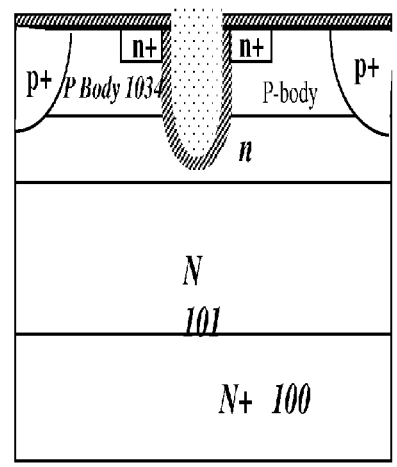
E Implant p-body and n+ source regions
F Implant deep P+ region
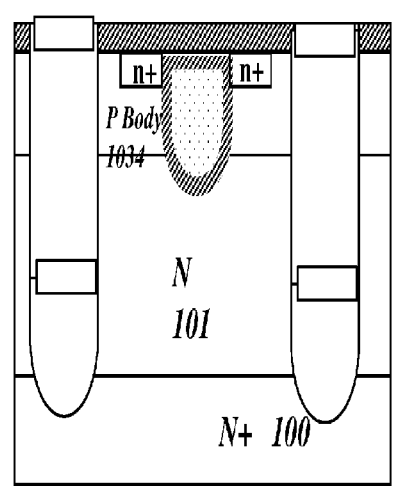
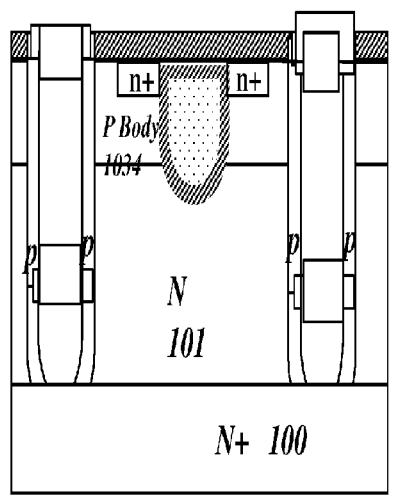
(g) Etch deep trenches
(h) Selectively grow or implant p column regions.
Figure 15 E-(h)

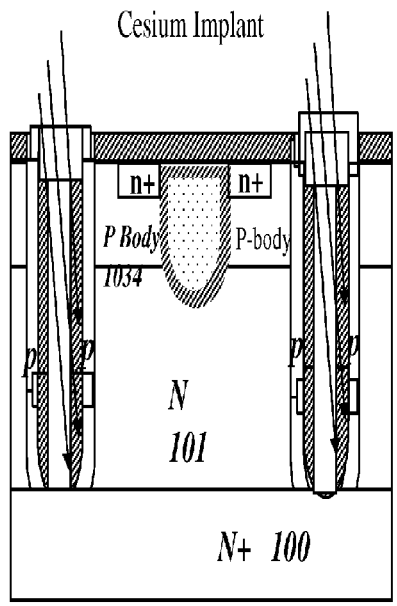
(i) Grow deep trench oxide and implant Cesium
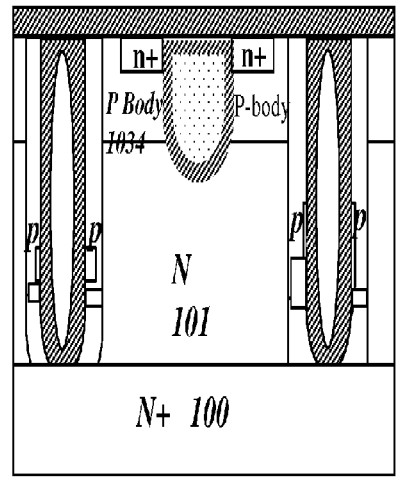
(j) Fill deep trenches with dielectric, deposit polysilicon..
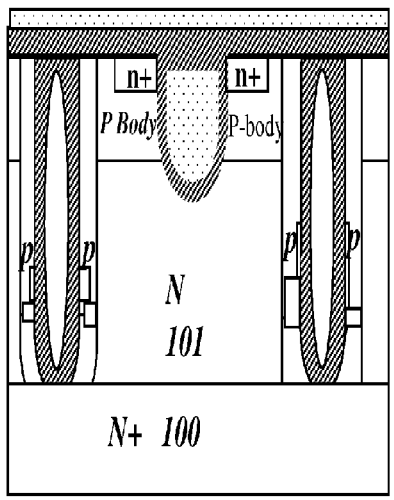
(k) Anneal
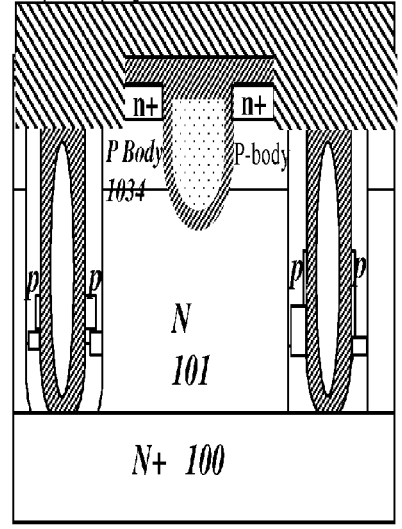
(l) Etch contacts, deposit source metal
Figure 15 (i)-(l)

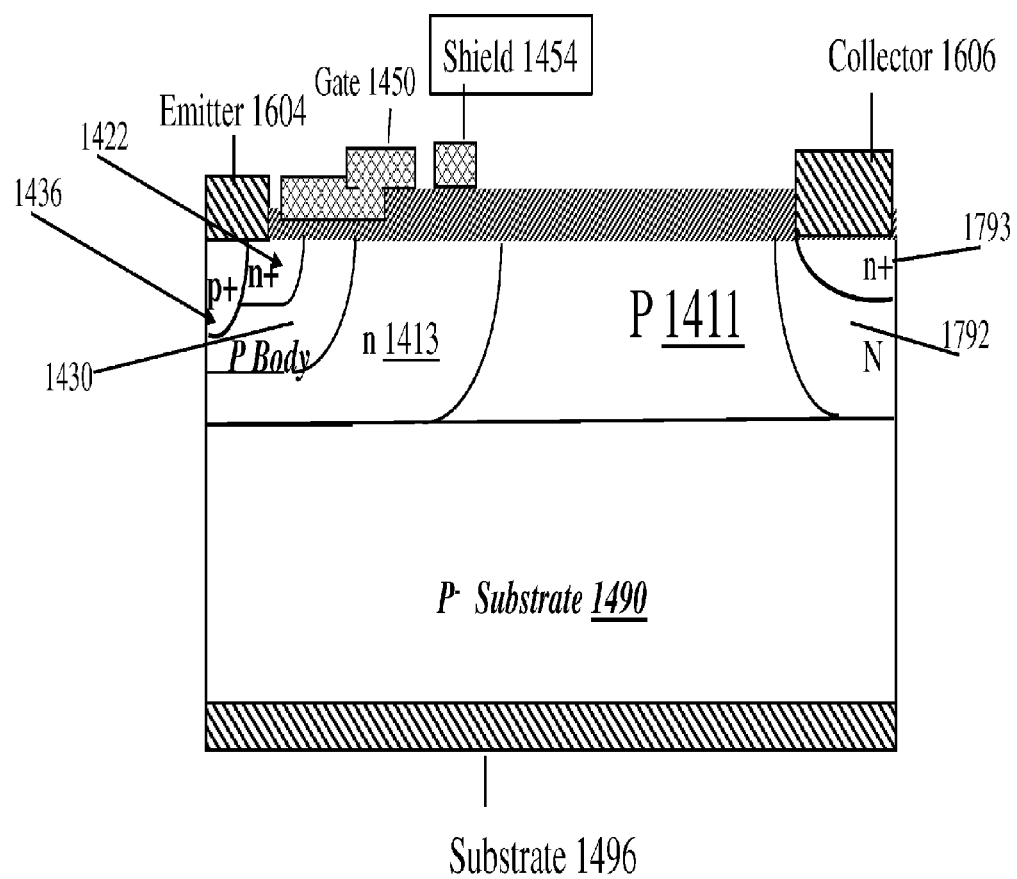
Figure 17B: A cross section along AA of the device shown in Figure 17A

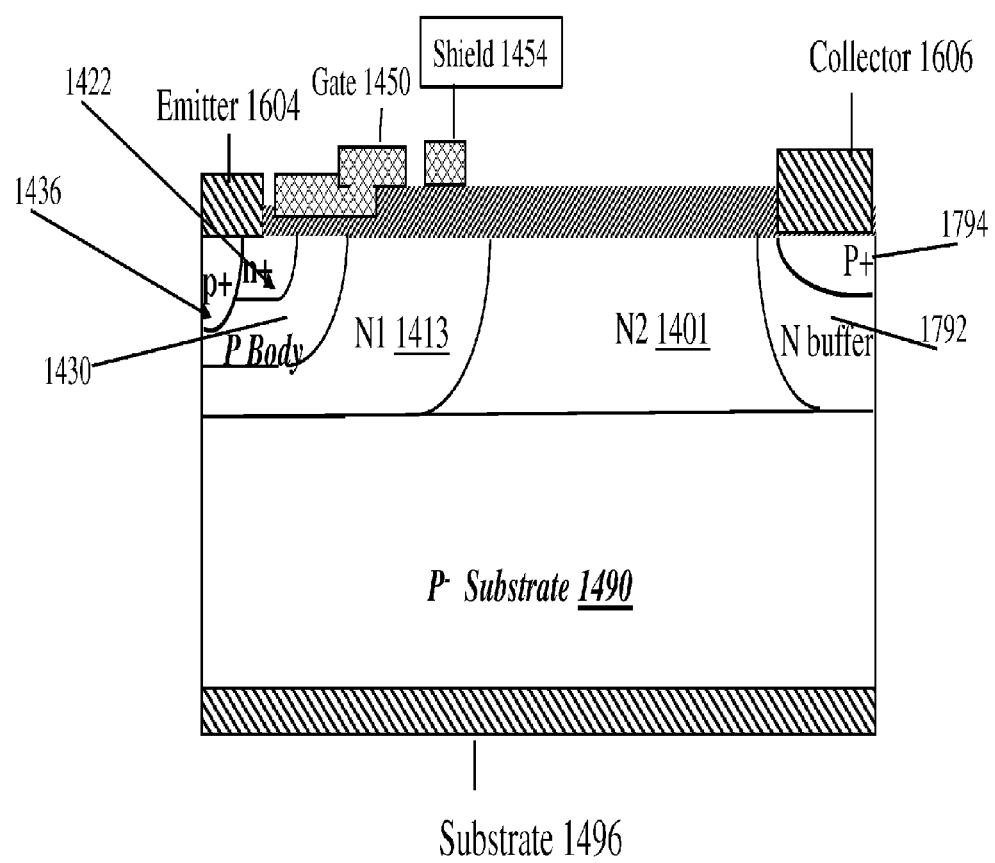
Figure 17C: A cross section along CC of the device shown in Figure 17A

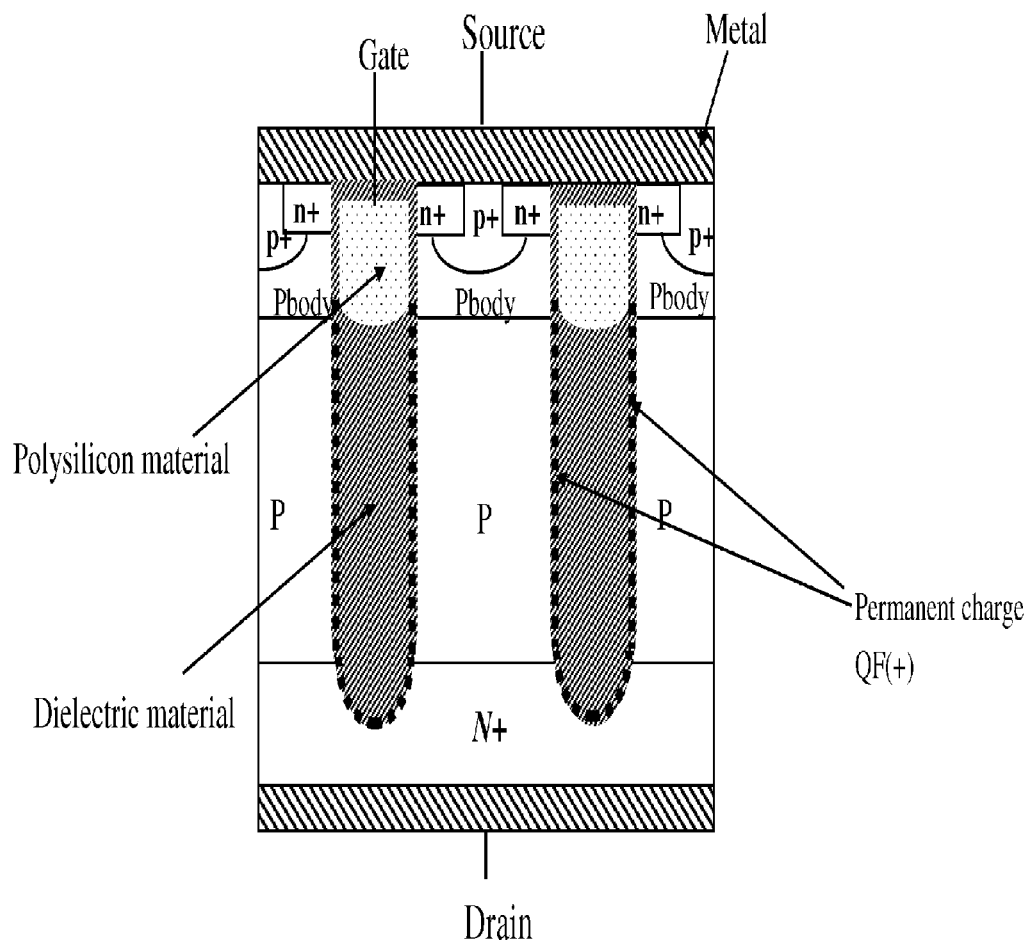
Figure 19: MOS transistor with trenches filled with dielectric material containing permanent charge and the gate electrode in the trench (Prior Art).

POWER SEMICONDUCTOR DEVICES, STRUCTURES, AND RELATED METHODS

CROSS-REFERENCE

Priority is claimed from U.S. provisional application 61/361,540 filed 6 Jul. 2010, and U.S. provisional application 61/494,205 filed 7 Jun. 2011, both of which are hereby incorporated by reference.

BACKGROUND

The present application relates to power semiconductor devices, and more particularly to vertical and lateral conduction devices which include immobile electric charge which statically inverts a semiconductor drift region.

Note that the points discussed below may reflect the hindsight gained from the disclosed inventions, and are not necessarily admitted to be prior art.

Power MOSFETs are widely used as switching devices in many electronic applications. In order to minimize the conduction power losses it is desirable that power MOSFETs have a low specific on-resistance ($R_{SP}$ or R*A), which is defined as the product of the on-resistance of the MOSFET multiplied by the active die area. In general, the on-resistance of a power MOSFET is dominated by the channel and drift region resistances.

Recently, inventions have been disclosed that incorporate fixed or permanent charges $Q_F$ in trenches filled with dielectric material such as silicon oxide ($SiO_2$). See for example US patent application 20080164518 which is hereby incorporated by reference. Positive permanent electrostatic charge can be formed within a device structure by, for example, implanting ions such as Cesium into a dielectric (such as SiO2).

FIG. 19 shows an example of such structures. In the MOSFET structure shown in FIG. 19 the gate electrode is formed in the same trench where the lower part is filled with a dielectric material that includes immobile positive electrostatic charge. The positive permanent charges balance the P layer's negative depletion charge in the off-state. The positive permanent charge also forms an induced electron drift region by forming an inversion layer along the interface between the oxide and the P layer. The induced inversion layer provides a path for electrons current flowing from the source and the channel to the drain.

In order to provide current continuity from the channel to the induced inversion layer, the gate electrode has to be in close proximity to the induced electron drift region. Therefore, special care is needed in fabricating such devices, in order to achieve both proper functionality and acceptable gate oxide reliability.

SUMMARY

The present application discloses several different inventions which in various ways, whether together or separately, provide multiple current paths, improved current spreading, improved device reliability, and/or improved processing simplicity. Many embodiments combine a dynamically inverted channel region with a statically inverted drift region, in separate locations of first-conductivity-type semiconductor material, with semiconductor material of the opposite conductivity type interposed therebetween along the majority carrier trajectories. In many embodiments parallel current paths are provided through both p-type and n-type drift regions, with immobile electrostatic charge used to generate a conduction path in one of the parallel current paths.

The disclosed innovations, in various embodiments, provide one or more of at least the following advantages. However, not all of these advantages result from every one of the innovations disclosed, and this list of advantages does not limit the various claimed inventions.

Reduced on-resistance;
Simpler fabrication;
Improved breakdown voltage; and/or
Better reliability.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1C schematically shows current flow in the device of FIG. 1A.

FIGS. 14A, 14B, 14C, and 14D, in combination, schematically show another example of an active device which implements some of the inventive teachings of this application.

FIGS. 15A-15L show examples of process steps for building various ones of the disclosed device structures.

FIGS. 17A-17C, in combination, schematically show another example of an active device which implements some of the inventive teachings of this application.

FIG. 19 shows a structure previously proposed by some or all of the present inventors.

DETAILED DESCRIPTION OF SAMPLE EMBODIMENTS

The present application discloses several different inventions which in various ways, whether together or separately, provide improved current conduction and spread, device reliability and processing simplicity. Many embodiments combine a dynamically inverted channel region with a statically inverted drift region, in separate locations of first-conductivity-type semiconductor material, with semiconductor material of the opposite conductivity type interposed therebetween along the majority carrier trajectories.

The numerous innovative teachings of the present application will be described with particular reference to presently preferred embodiments (by way of example, and not of limitation). The present application describes several inventions, and none of the statements below should be taken as limiting the claims generally.

Figure 1A:
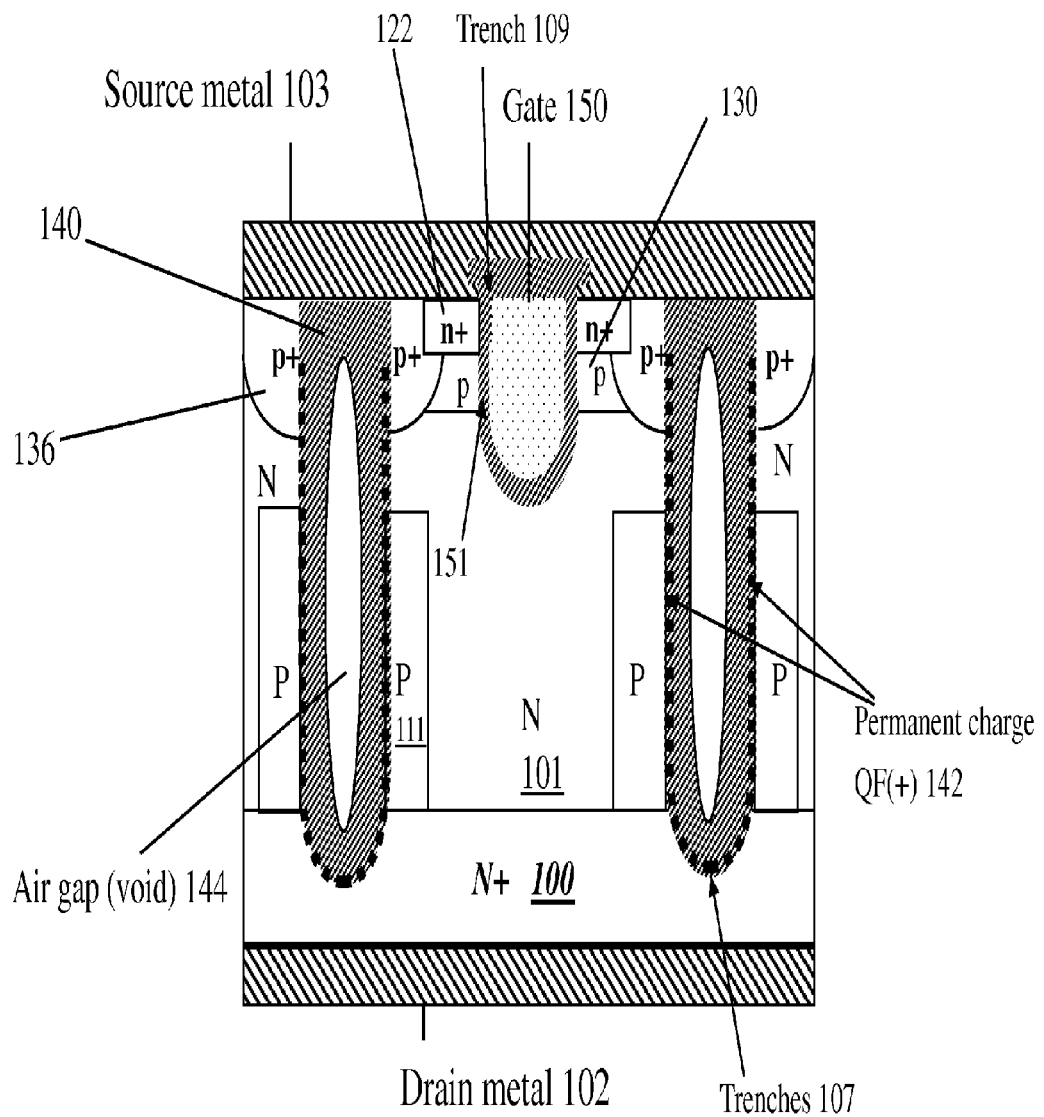
FIG. 1A and FIG. 1B, in combination, schematically show an example of an active device which implements some of the inventive teachings of this application.
Figure 1B:
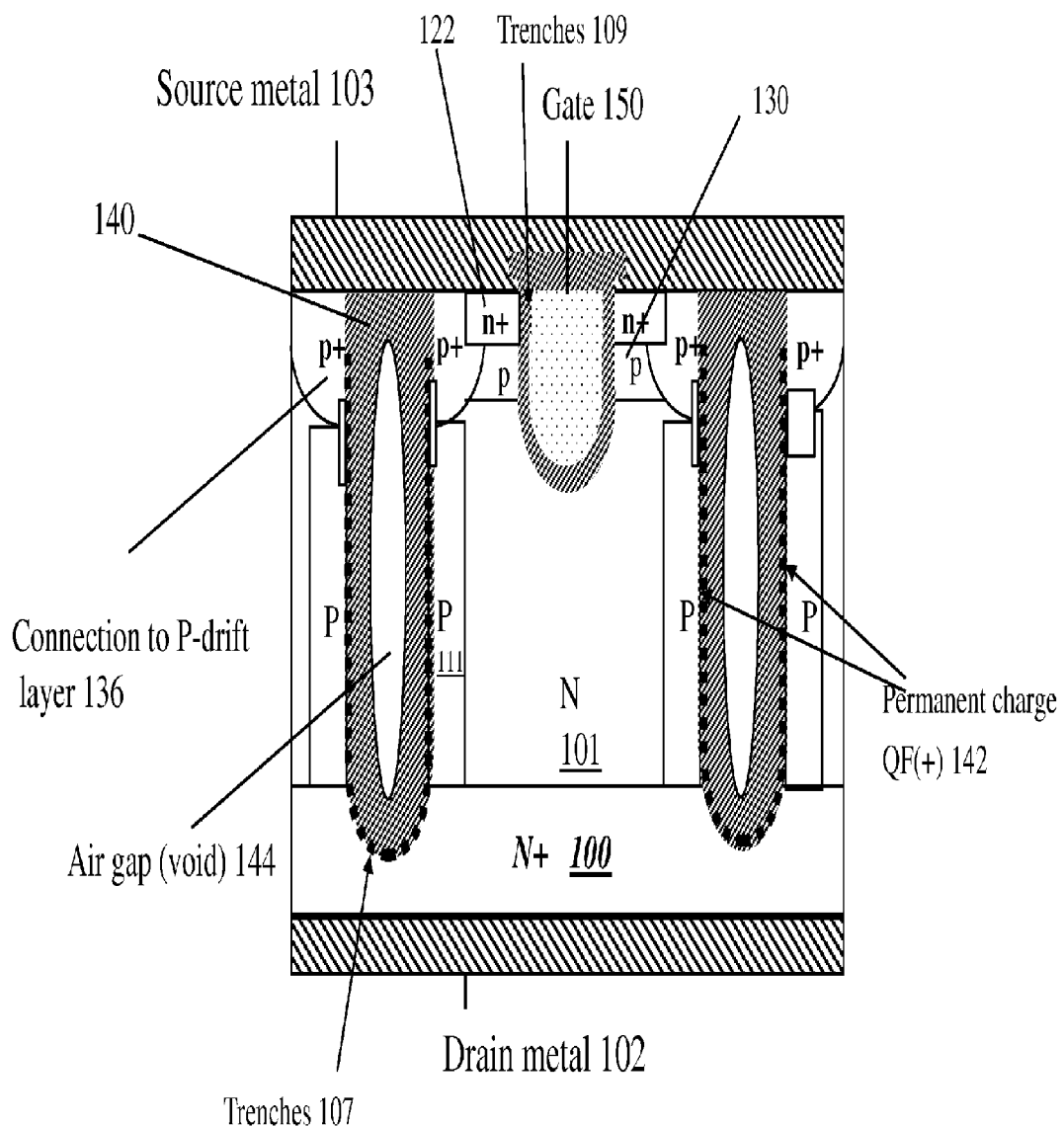

FIGS. 1A and 1B, in combination, show an example of an n-channel device according to some of the inventive teachings. The device illustrated includes trenches 107 which are filled with dielectric material 140 containing permanent charge 142. In this particular example, a void 144 is located in the interior of the dielectric material 140, but this is not true of all embodiments.

A gate electrode 150 is located in a shallower trench 109. The gate electrode is capacitively coupled, through a gate dielectric 151, to a p-type body region 130, so that when a sufficiently positive voltage is applied to electrode 150, part of body region 130 can be inverted to form a channel. When this occurs, electrons are able to pass from n+ semiconductor region 122 through the channel into the n-type epitaxial material 110, and thence (at locations like that shown in FIG. 1A) into the inverted portion of the p-type region 111.

The p-type region 111 can be formed, for example, by selective epitaxial growth or by an angle implant which hits the sidewalls of the trench 107, followed by a subsequent drive in step. Further details of fabrication will be discussed below.

Since the inversion layer in the p-type region 111 conducts electron current in parallel with the remaining portions of the epitaxial layer 110, the p-type regions will be referred to herein as "p-type pillars," and the n-type epitaxial layer regions which parallel the p-type pillars will be referred to as "n-type pillars."

In this example, the p-type pillars 111 are electrically tied to the source metallization 103 by a connection at some locations (e.g. as shown in FIG. 1B) through a p+ region 136. At other locations, as shown in FIG. 1A, the pillars 111 and the p+ region 136 do not meet; this permits electrons to flow into the inverted portion of the p-type pillar 111.

Note that the region 136 also connects the source metallization to the p-type body region 130.

The permanent charge 142 has a net density near or at the dielectric-to-semiconductor interface which is high enough to invert adjacent portions of the p-type pillar 111. In one example, the permanent charge 142 has a net charge density of $q*1.25E12/cm^2$ where q is the electron charge, and the p-type pillars 111 have a net dopant concentration of $2.5E16/cm^3$ and a width of 1 μm.

In the ON state, electrons which flow through the inverted portion of the body 130 flow through two paths, in parallel, to the drain diffusion 100: some of these electrons flow through the n-type pillars 101, and some flow through the inverted portions of the p-type pillars 111. The n+ drain is contacted by drain metallization 102. Of course, the entire p-type pillar 111 is not necessarily inverted, so that only a fraction of the pillar 111 carries electron current.

FIG. 1C schematically shows current flow in the device of FIG. 1A.

Figure 2:
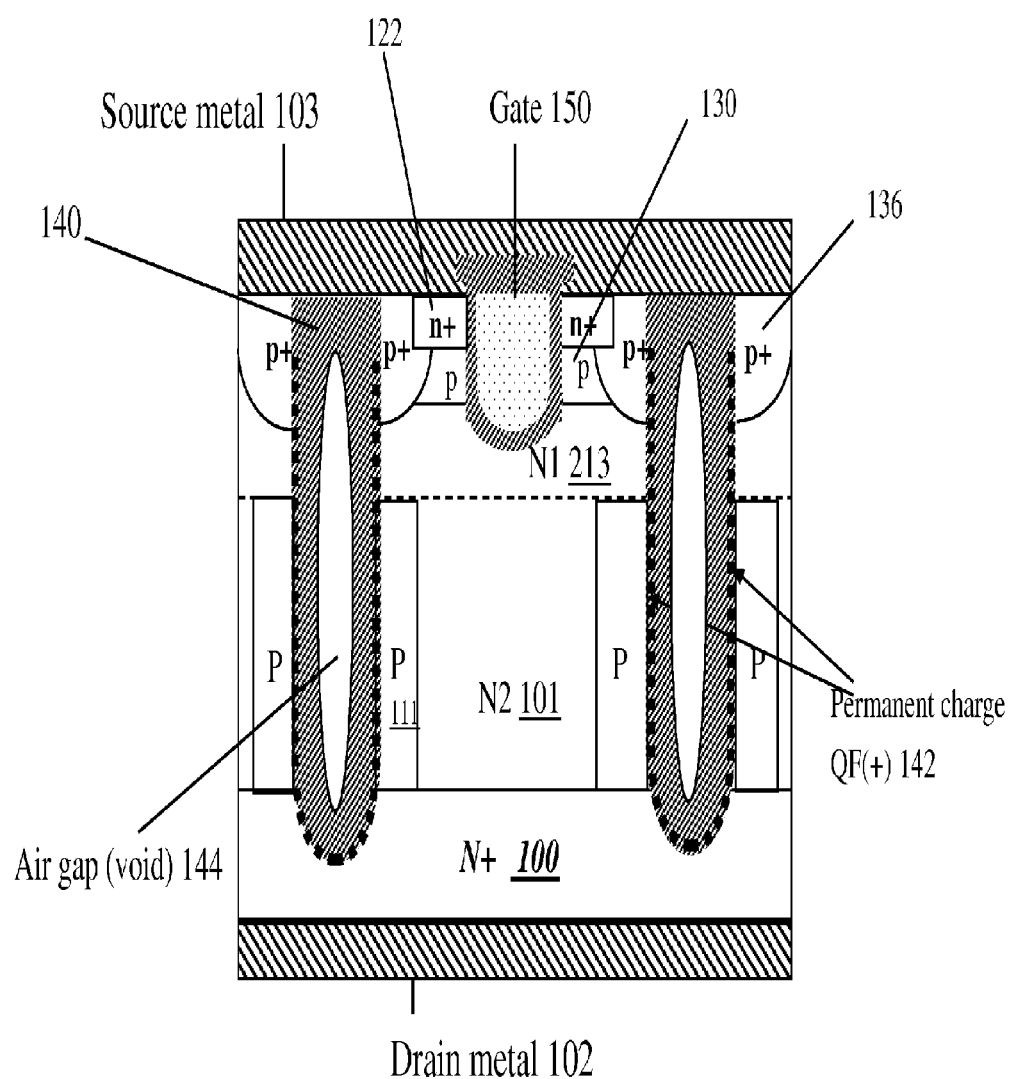
FIG. 2 schematically show another example of an active device which implements some of the inventive teachings of this application.

FIG. 2 shows an alternative embodiment, in which an intermediate layer 213 provides lateral conduction between the channel (i.e. the portion of body 130 which is inverted by gate 150 in the ON state) and the inverted portion of the p-type pillars 111. In this example, the intermediate layer 213 has a higher dopant concentration N1 than the coping concentration N2 of the deeper part of the n-type pillar 101. Thus one component of spreading resistance is reduced, while the voltage withstand provided by the n-type and p-type drift regions is not degraded.

Figure 3:
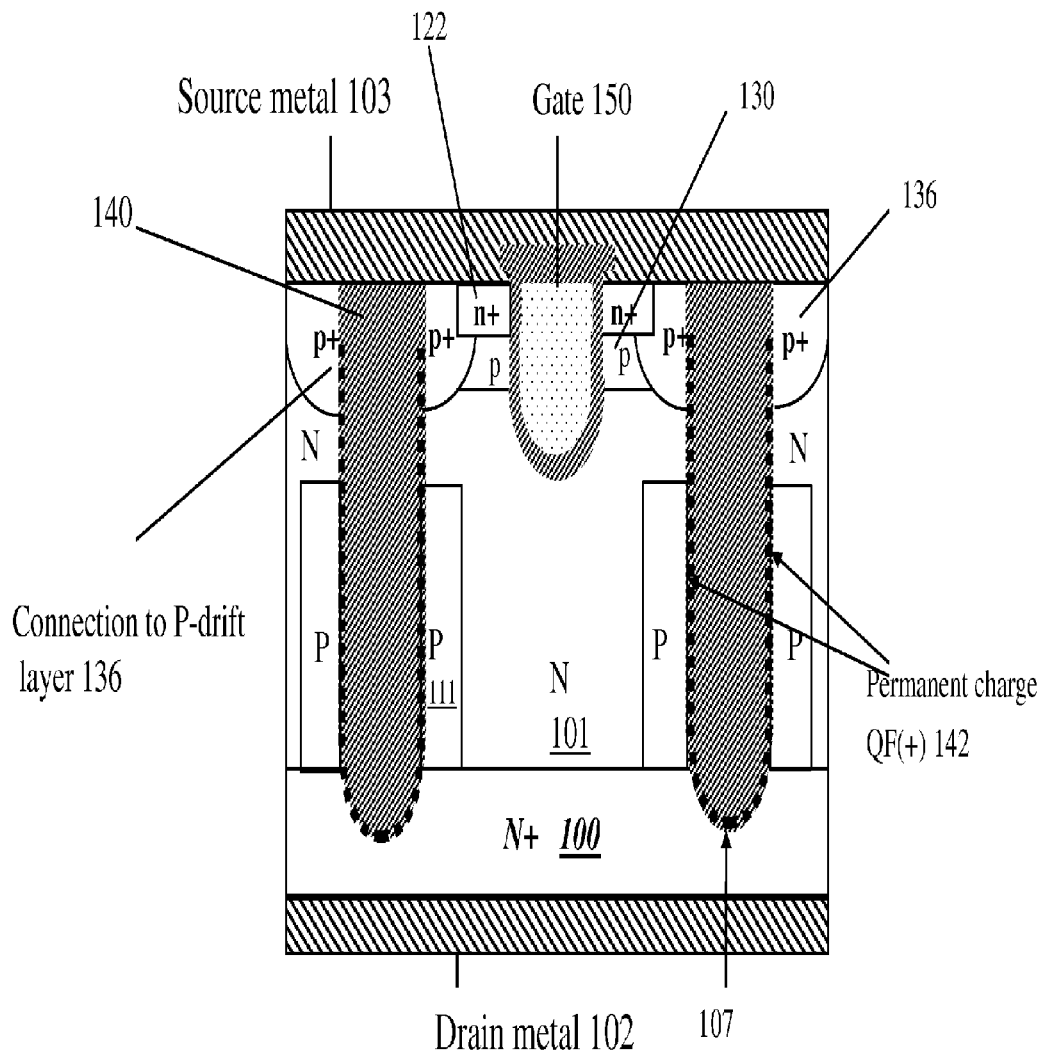
FIG. 3 schematically shows another example of an active device which implements some of the inventive teachings of this application.

FIG. 3 shows a MOS transistor which is generally somewhat similar to that shown in FIG. 1A, except that voids 144 are not used in this embodiment. Connection of the p-type pillar 111 to the p+ body contact is done, for example, at locations outside of the plane of this drawing, analogously to that shown in FIG. 1B.

Figure 4:
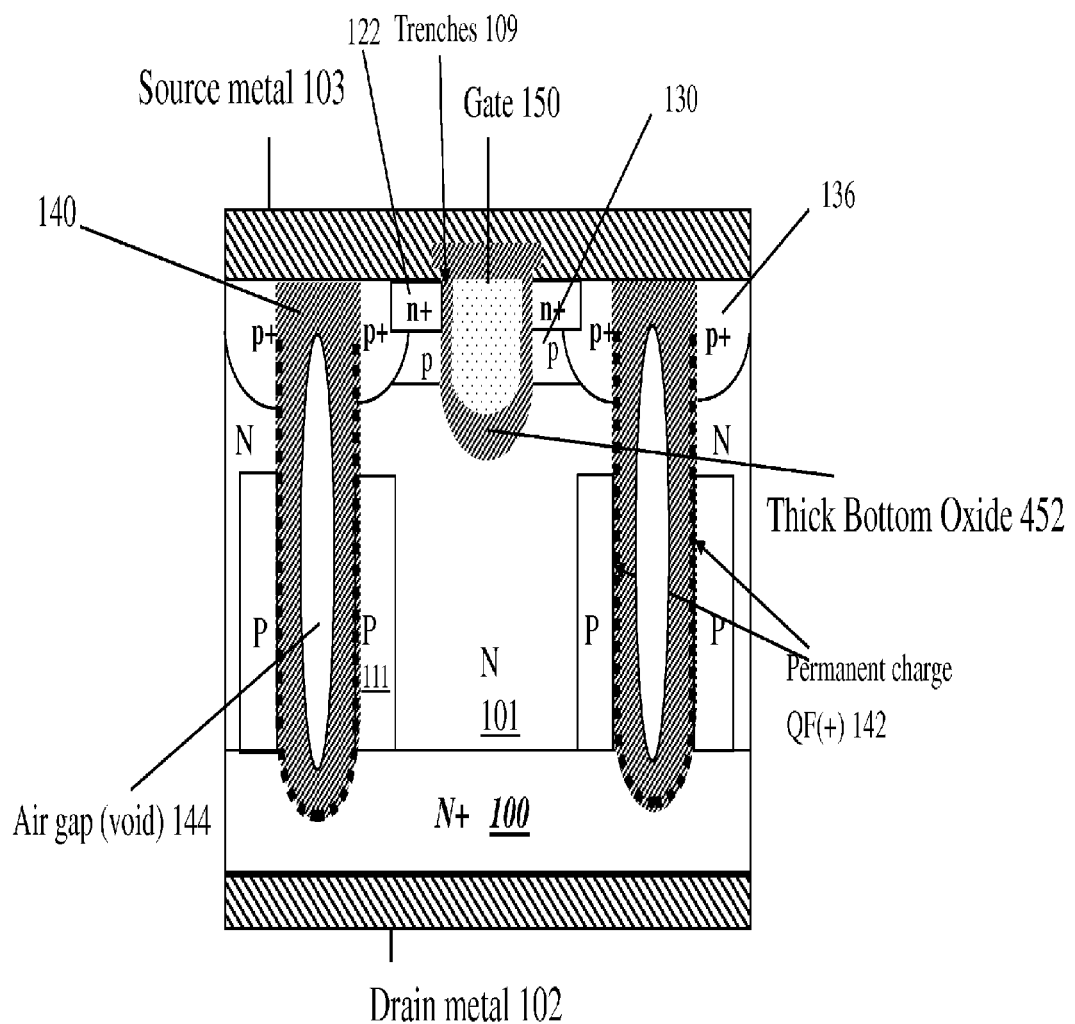
FIG. 4 schematically shows another example of an active device which implements some of the inventive teachings of this application.

FIG. 4 shows a MOS transistor which is generally somewhat similar to that shown in FIG. 1A, except for the presence of a thick bottom oxide 452 under the gate electrode 150 in trench 109.

Figure 5:
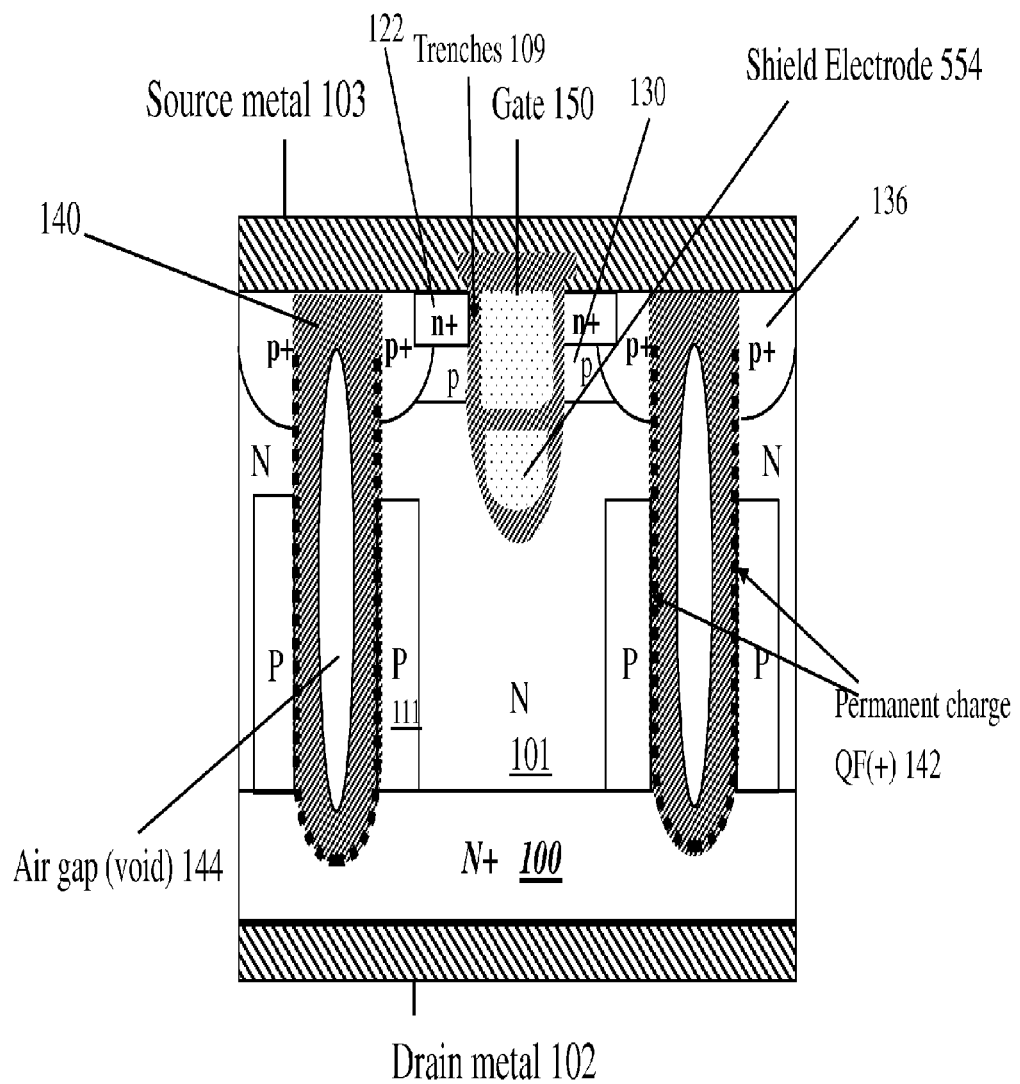
FIG. 5 schematically shows another example of an active device which implements some of the inventive teachings of this application.

FIG. 5 shows a MOS transistor which is generally somewhat similar to that shown in FIG. 1A, except for the presence of a shield electrode 554 under the gate electrode 150 in trench 109. The shield electrode is preferably connected to the source electrode 103 at some locations of the device (not shown). This provides a lower gate-drain capacitance Cgd. Alternatively, the shield electrode can be connected to a different fixed potential, or otherwise.

Figure 6:
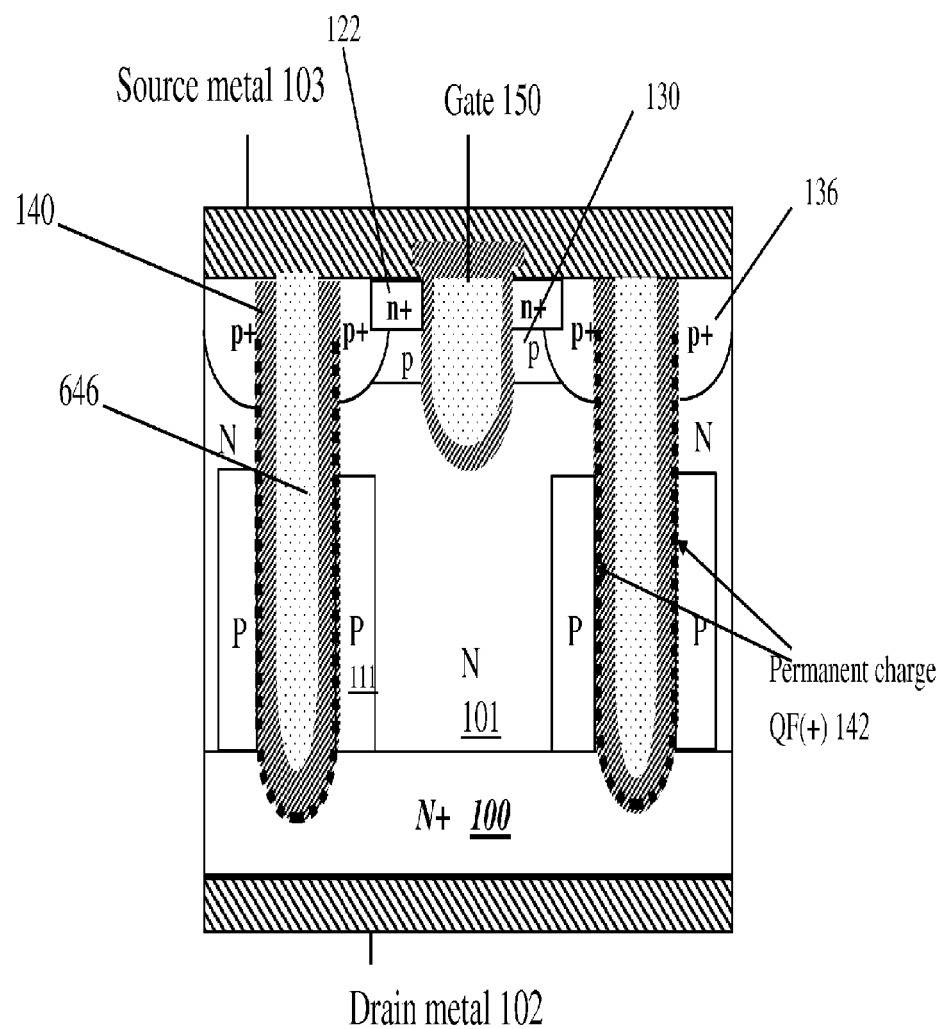
FIG. 6 schematically show another example of an active device which implements some of the inventive teachings of this application.

FIG. 6 shows a MOS transistor which is generally somewhat similar to that shown in FIG. 3, except for the presence of field plates 646 in the trenches 107. In this example the field plates 646 are tied to the source metal 103, but other biasing can be used if desired. In this example the field plates 646 are made of heavily doped polysilicon.

Figure 7:
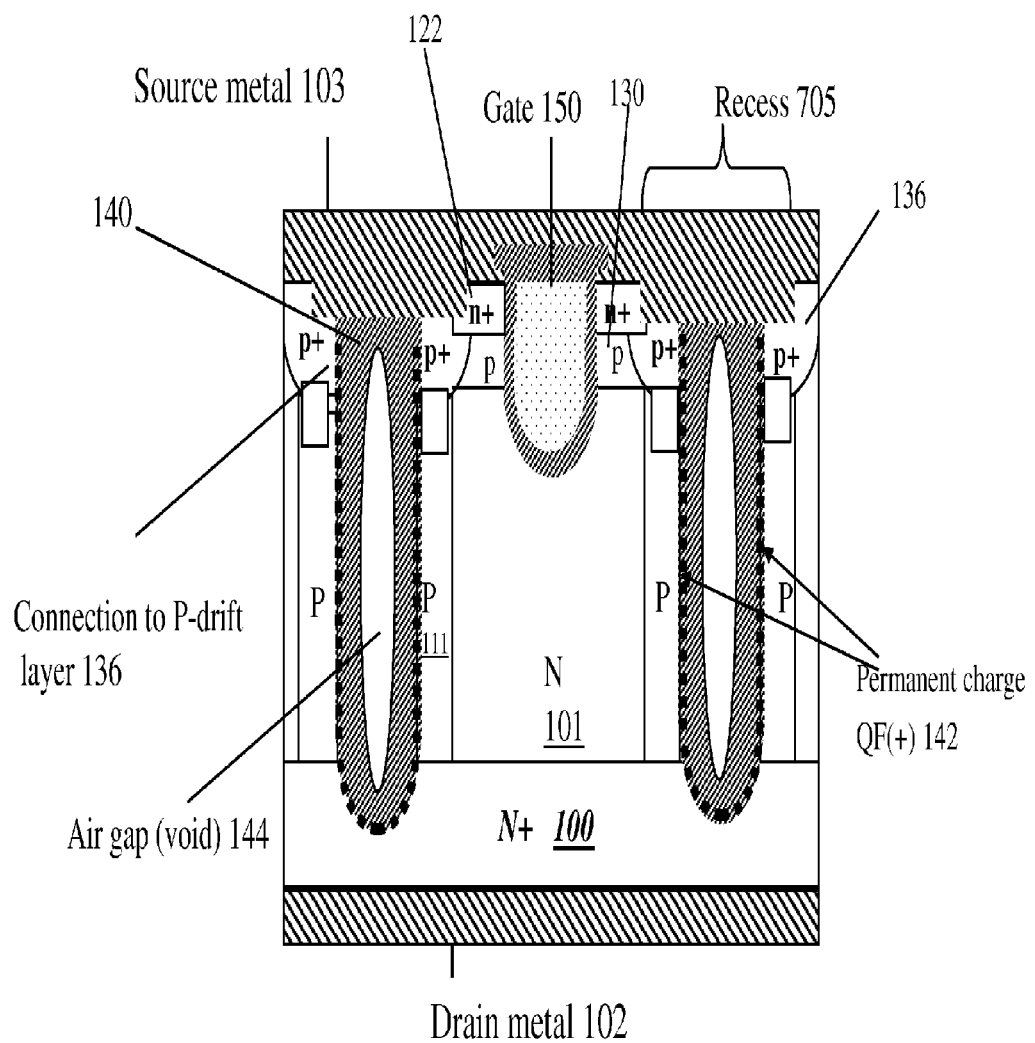
FIG. 7 schematically shows another example of an active device which implements some of the inventive teachings of this application.

FIG. 7 shows a MOS transistor which is generally somewhat similar to the structure shown in FIG. 1B, except for the presence of a recessed source contact: a recess 705 has been etched over the top of trench 107, before the source metallization 103 is formed. The location shown has a connection from the p-type pillar 111 to the p+ body contact 136 (like that in FIG. 1B), but at other locations the tops of pillars 111 would not merge with the p+ 136.

Figure 8:
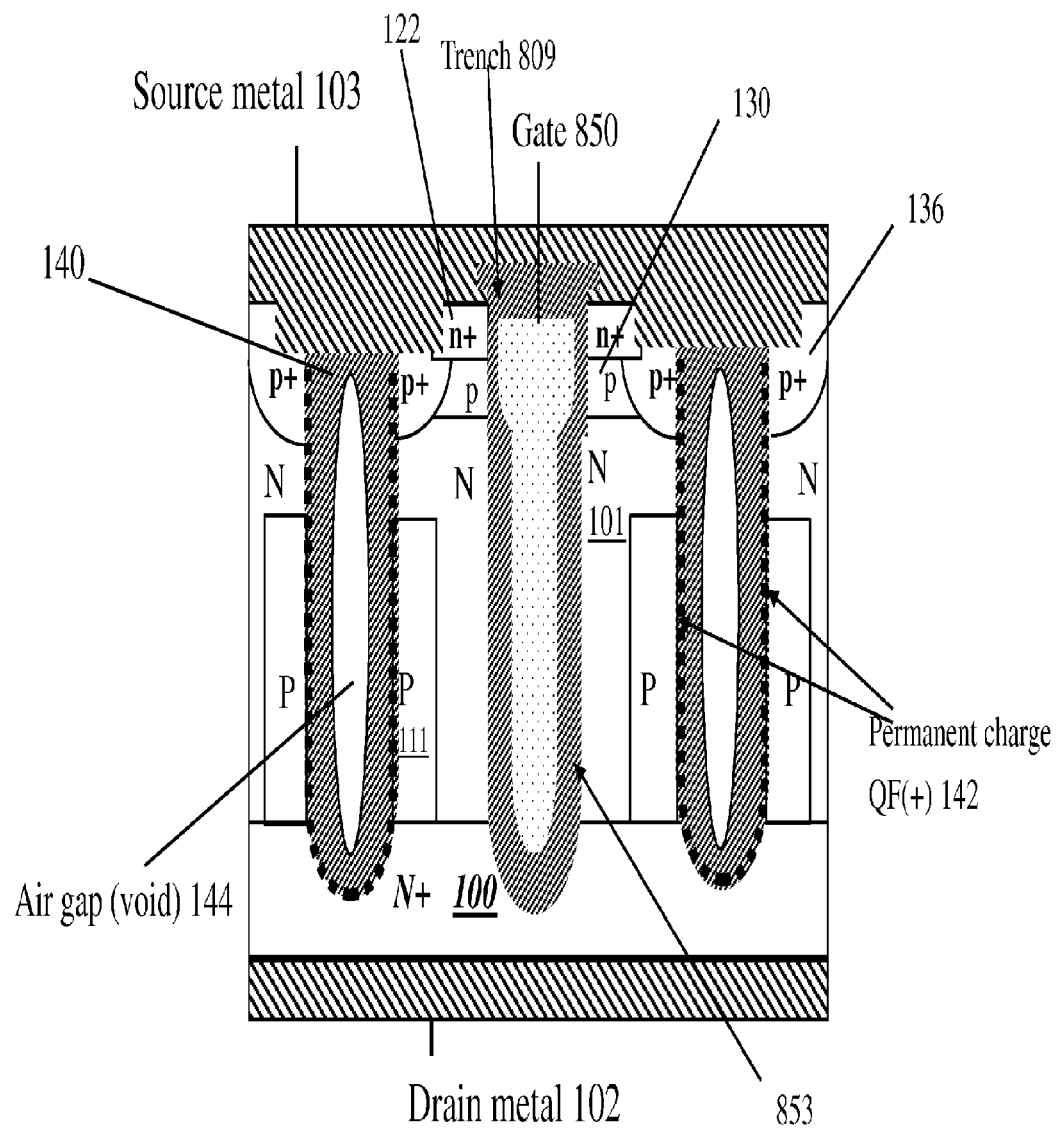
FIG. 8 schematically shows another example of an active device which implements some of the inventive teachings of this application.

FIG. 8 shows another active device structure which is generally somewhat similar to that shown in FIG. 1A, except that a much deeper trench 809 replaces the gate trench 109, and a deep T-shaped gate electrode 850 replaces the gate electrode 150. Note that the deeper part of the T-shaped gate electrode is surrounded by a dielectric 853 which is thicker than the gate dielectric 151. This family of structures provides a higher doping in N region 101, and hence lower specific on-resistance $R_{SP}$, without degrading breakdown voltage.

Figure 9:
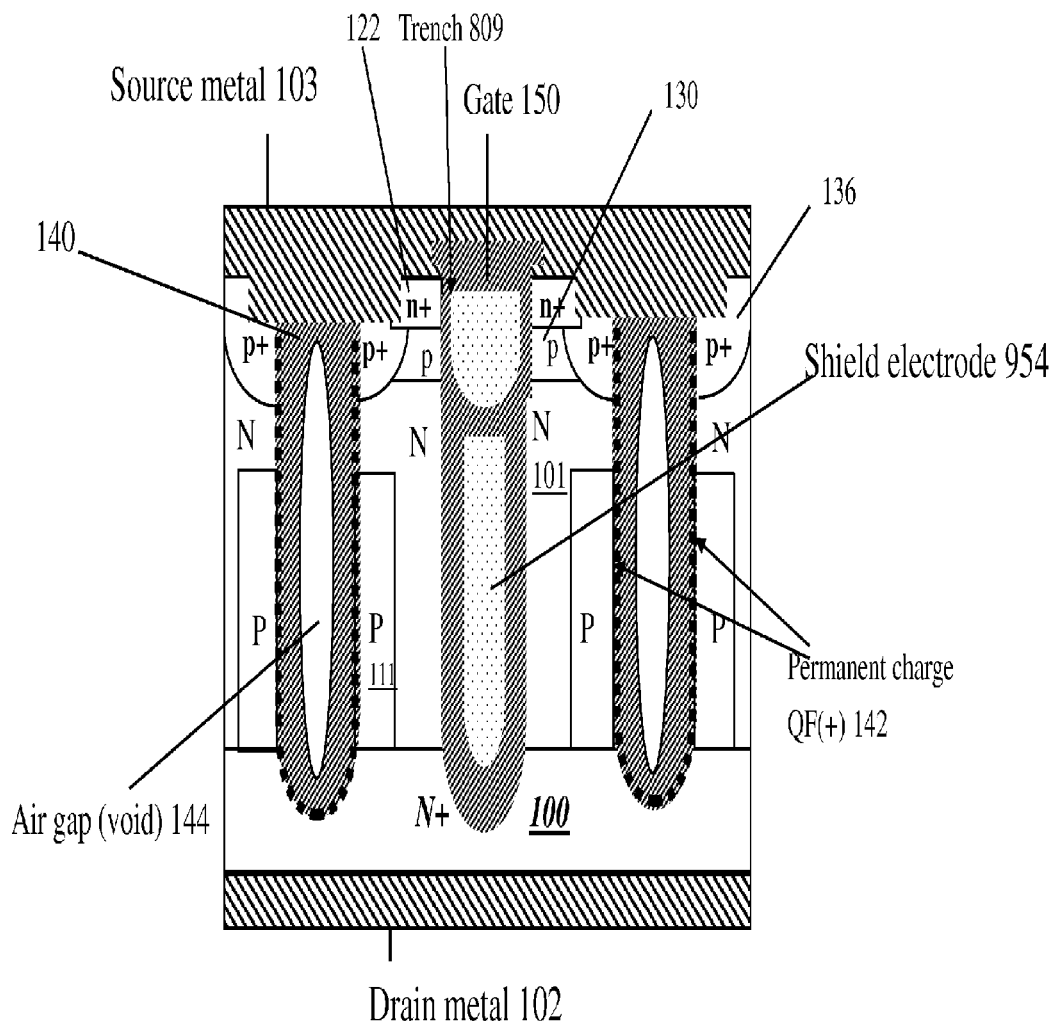
FIG. 9 schematically shows another example of an active device which implements some of the inventive teachings of this application.

FIG. 9 shows a MOS transistor which is generally somewhat similar to that shown in FIG. 8, except that for the presence, in the deep gate trenches 809, of a shield electrode 954. This is preferably made of polysilicon material tied to the source electrode.

Figure 10A:
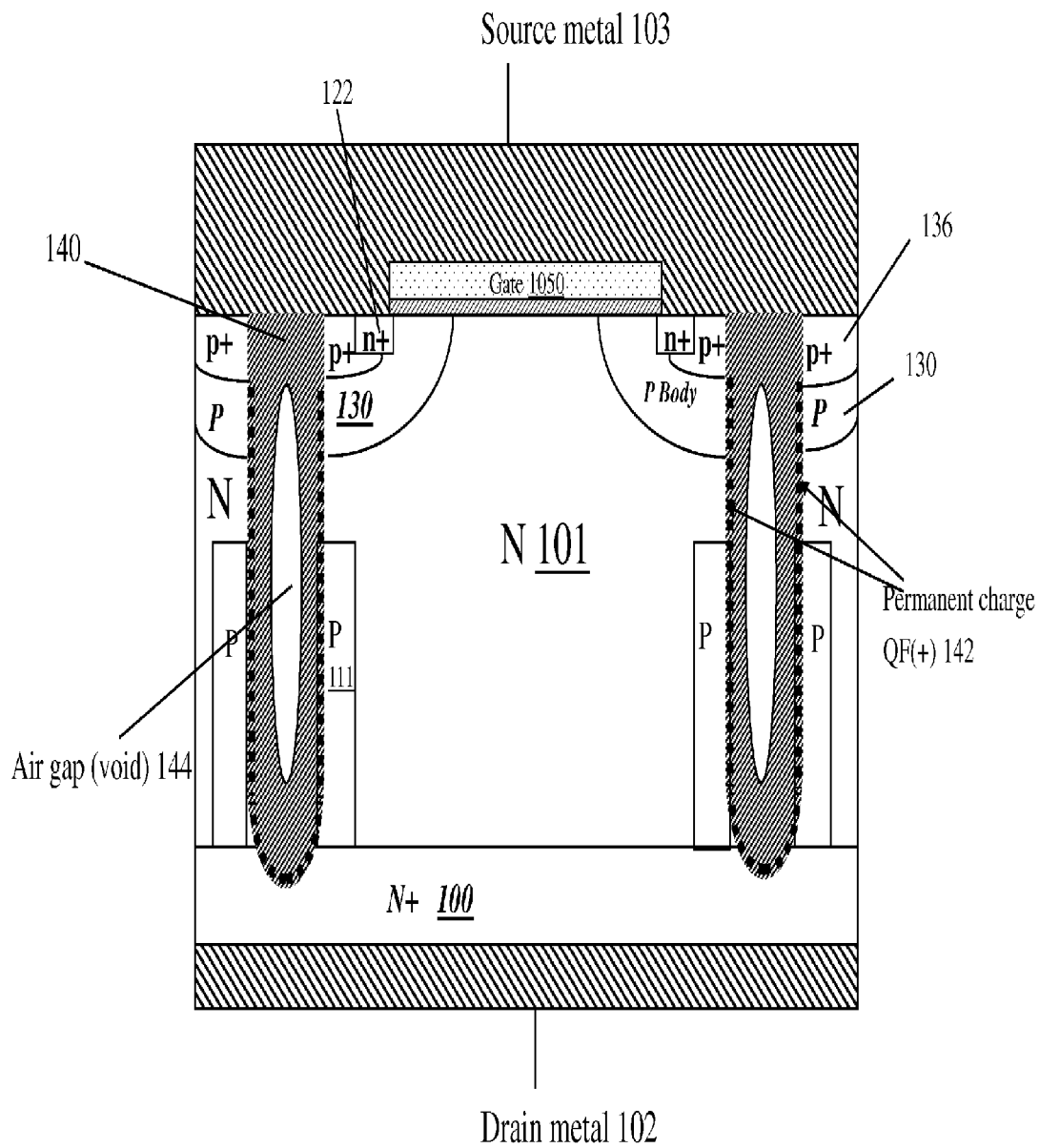
FIGS. 10A and 10B, in combination, schematically show another example of an active device which implements some of the inventive teachings of this application.
Figure 10B:
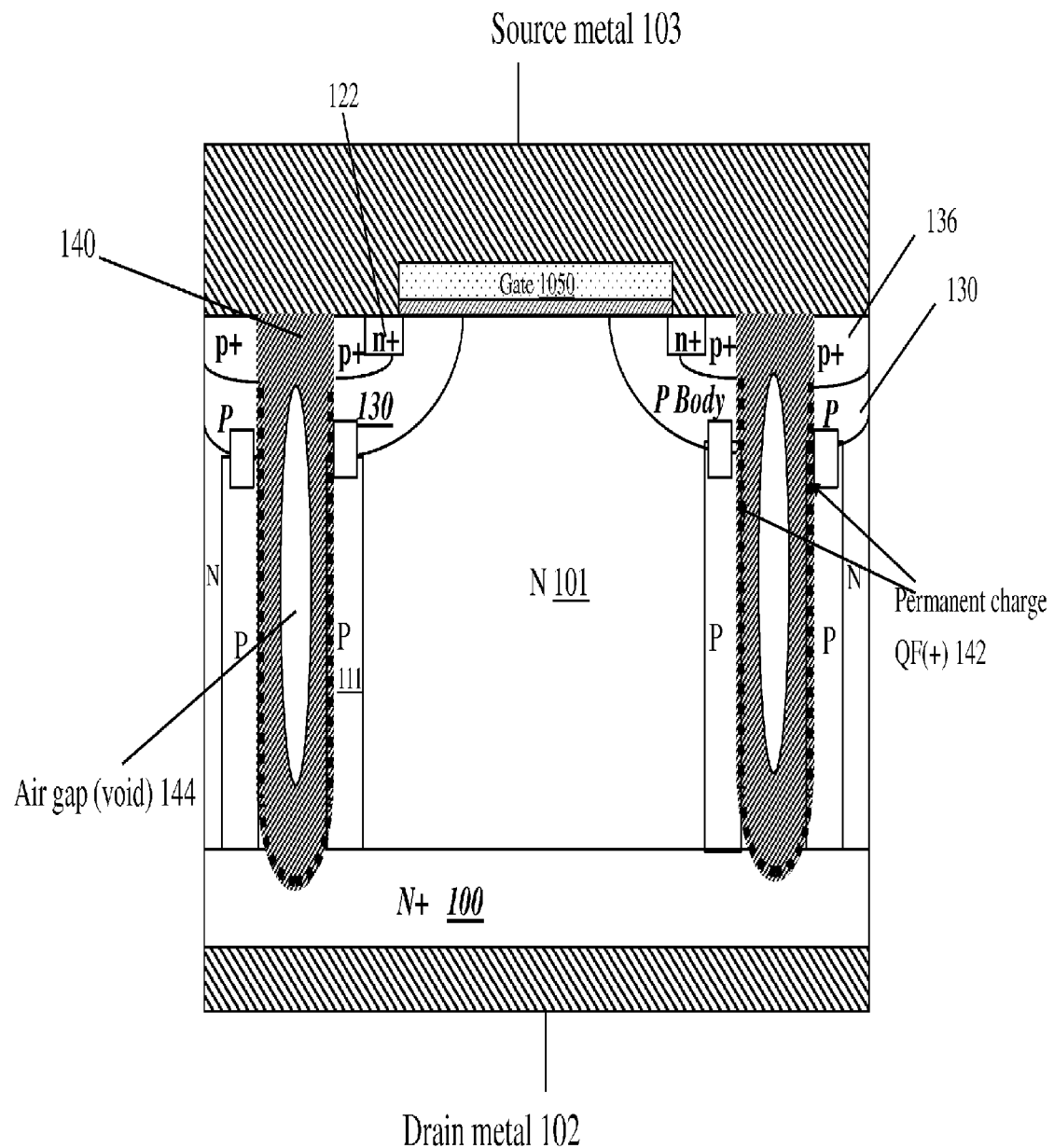

FIGS. 10A and 10B, in combination, show a MOS transistor which implements the intermediate conduction layer and paralleled drift pillars with a planar gate electrode 1050.

Figure 10C:
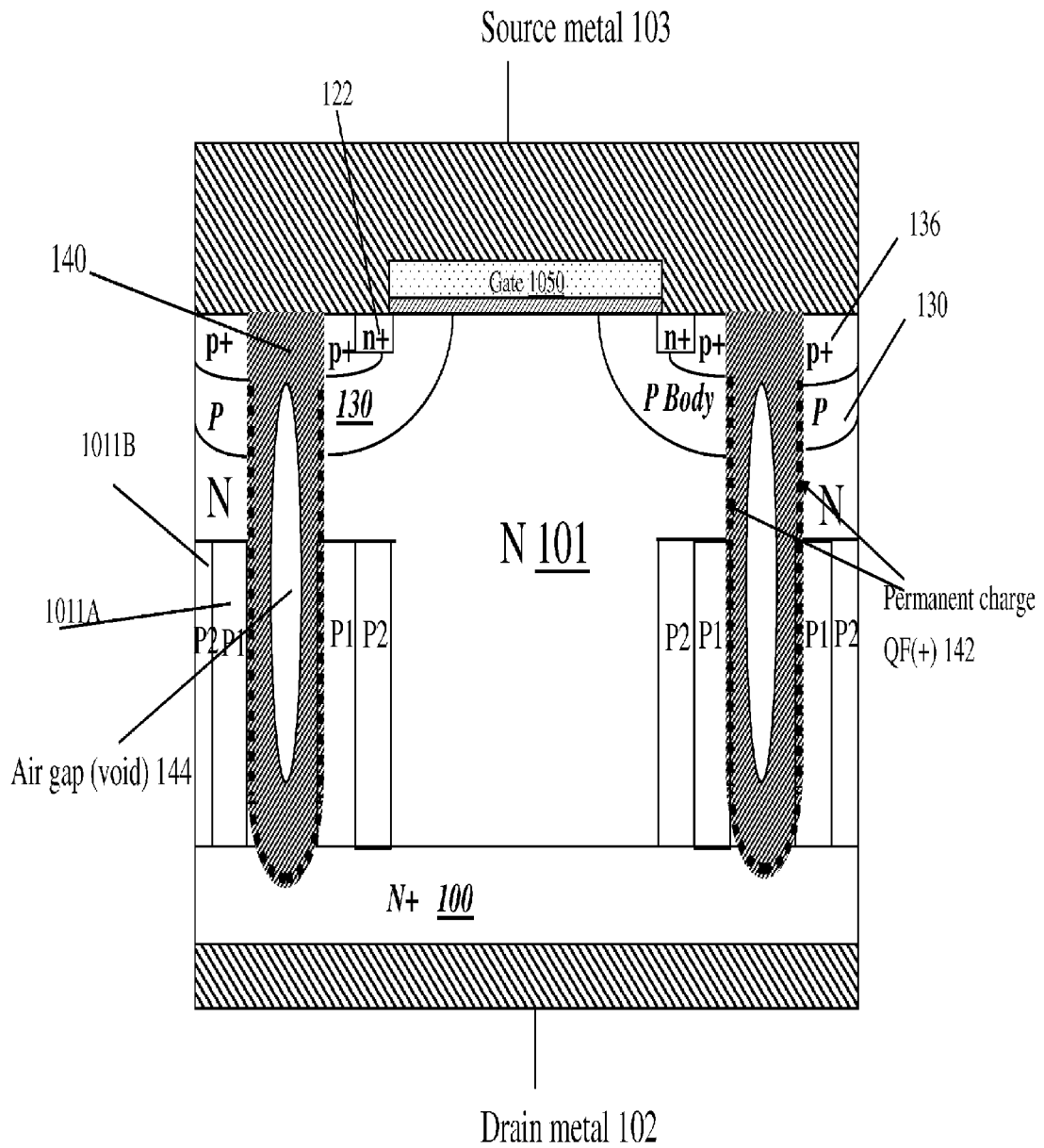
FIGS. 10C and 10D, in combination, schematically show another example of an active device which implements some of the inventive teachings of this application.
Figure 10D:
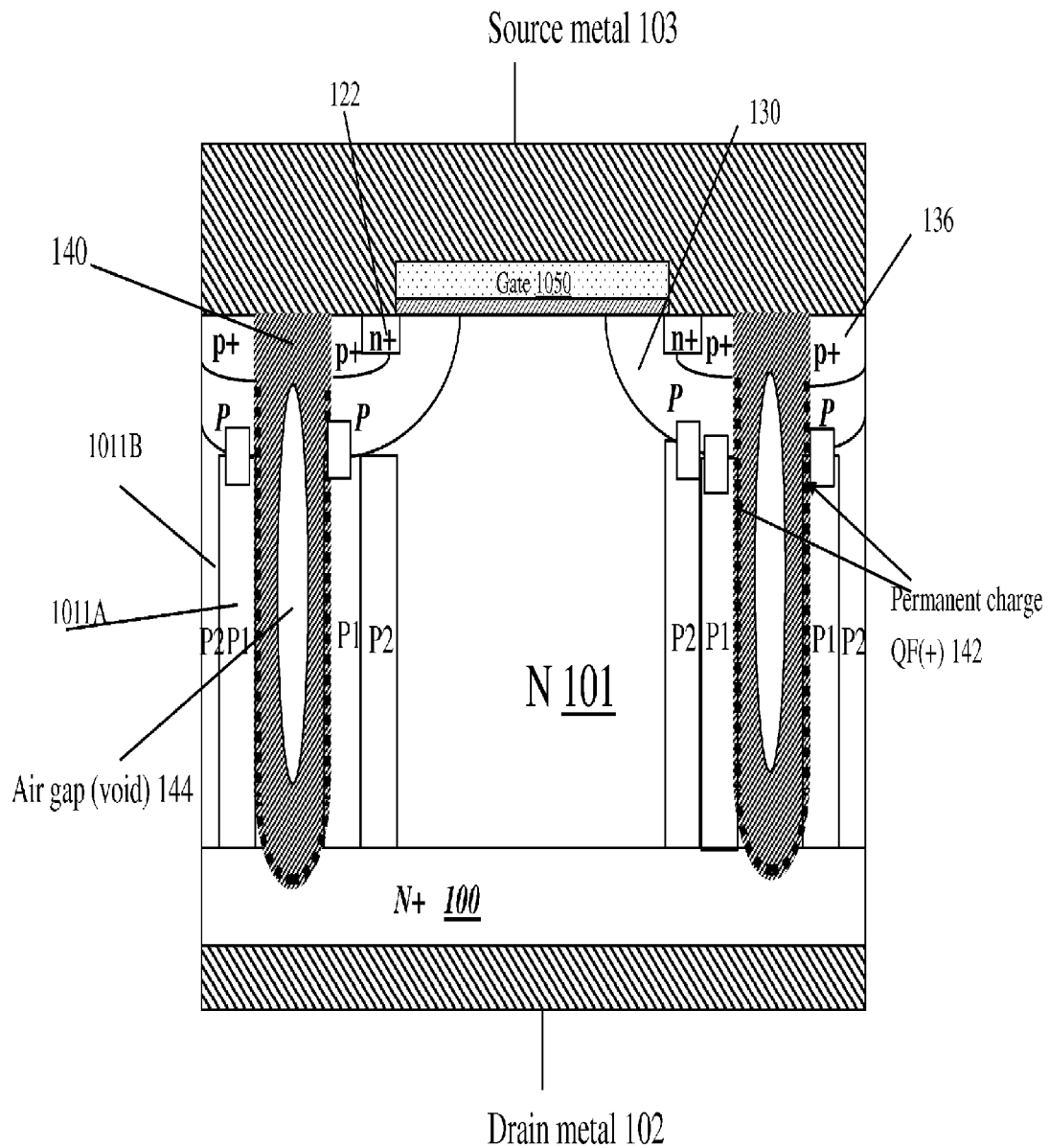

FIGS. 10C and 10D, in combination, show a MOS transistor which is somewhat similar to that shown in FIGS. 10A and 10(B), except that the P pillars have stepped or variable doping concentrations.

Figure 11:
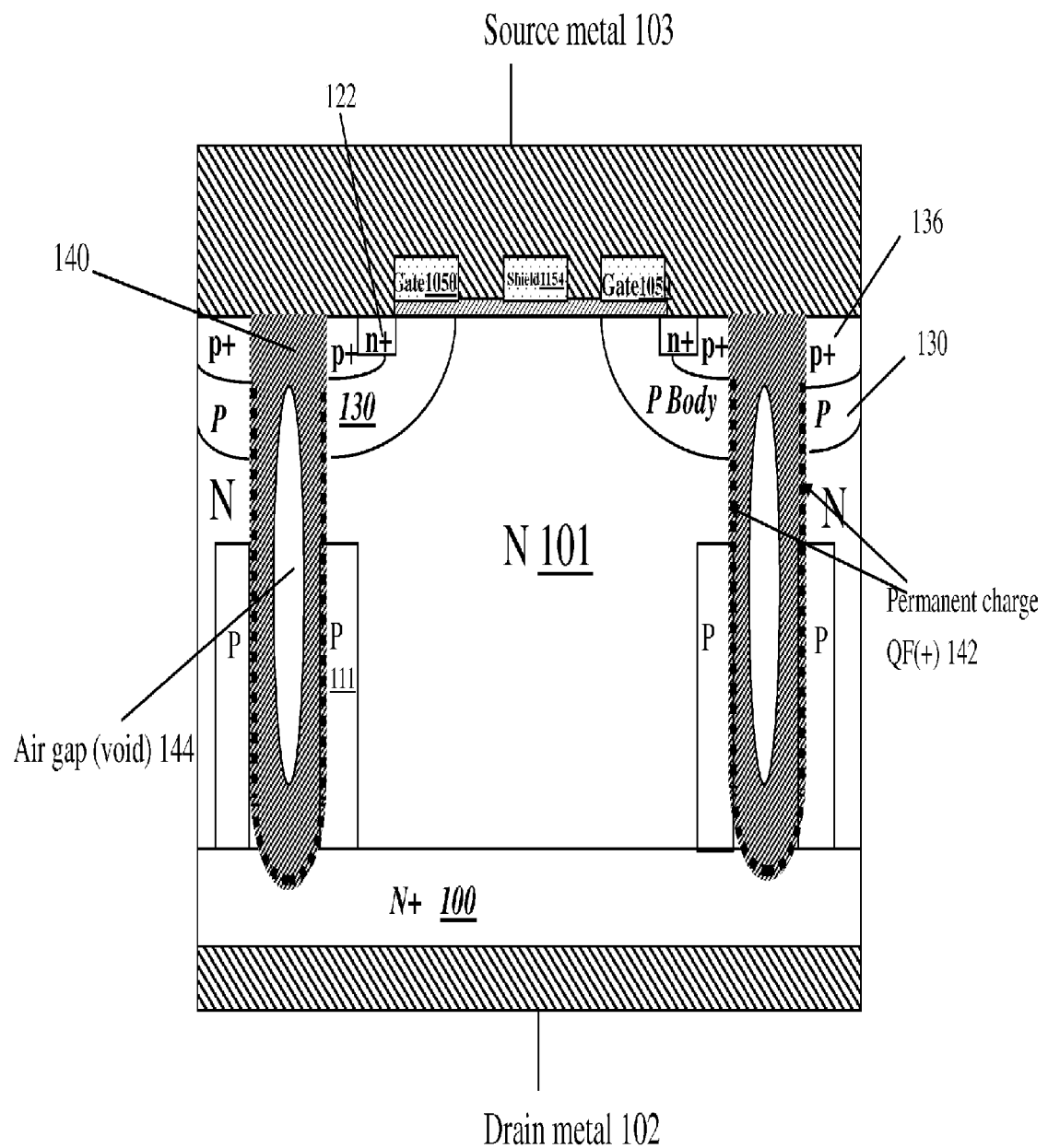
FIG. 11 schematically shows another example of an active device which implements some of the inventive teachings of this application.

FIG. 11 shows a MOS transistor which is generally somewhat similar to that shown in FIG. 10B, except for the presence of a shield electrode 1154 which is connected to the source electrode.

Figure 12:
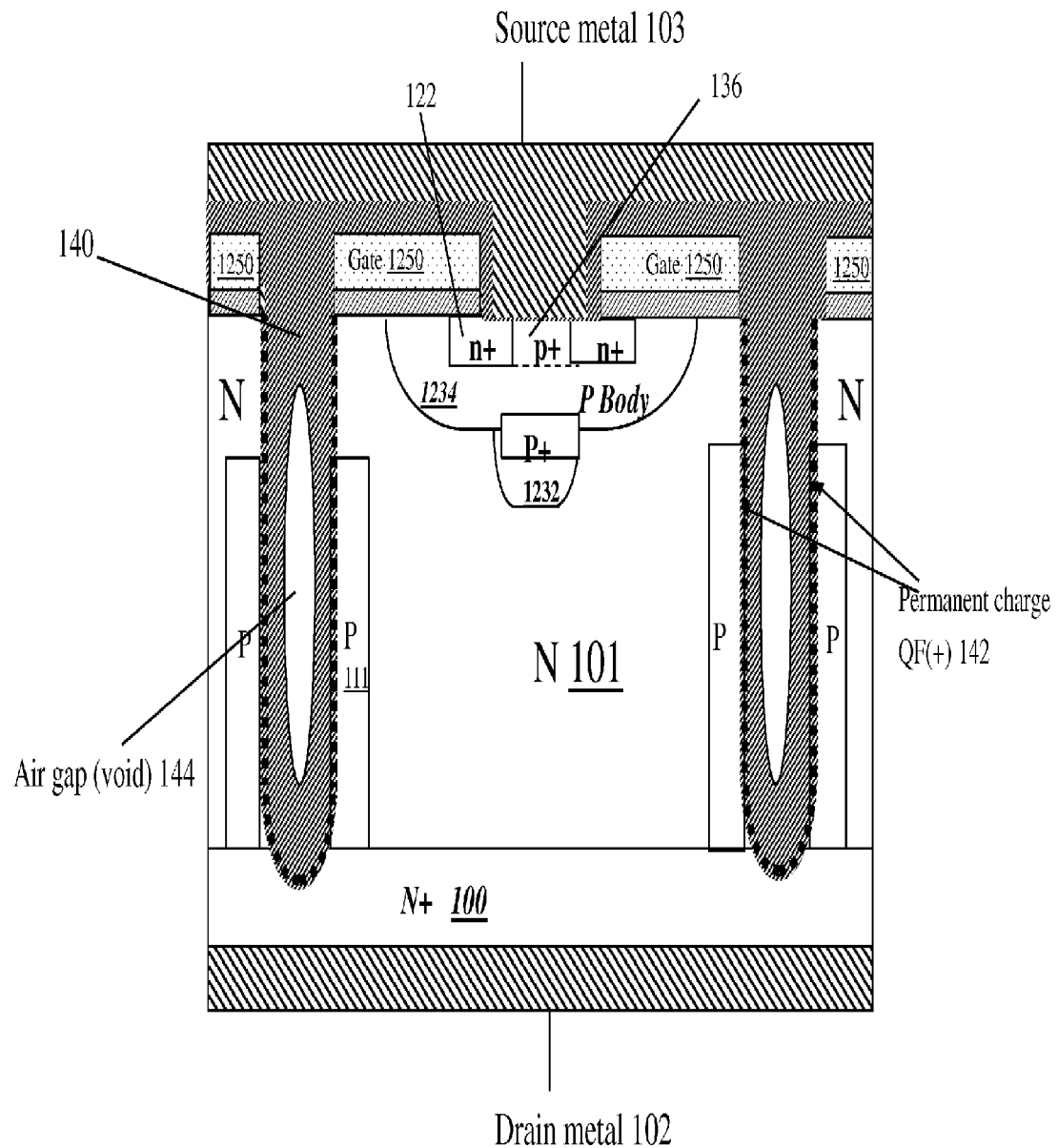
FIG. 12 schematically shows another example of an active device which implements some of the inventive teachings of this application.

FIG. 12 shows a MOS transistor which is generally somewhat similar to that shown in FIG. 10B, but with a different planar gate configuration. Note that majority carrier injection is located closer to the p-pillar (rather than over the N-pillar), as compared to the embodiment of FIG. 10A.

Figure 13:
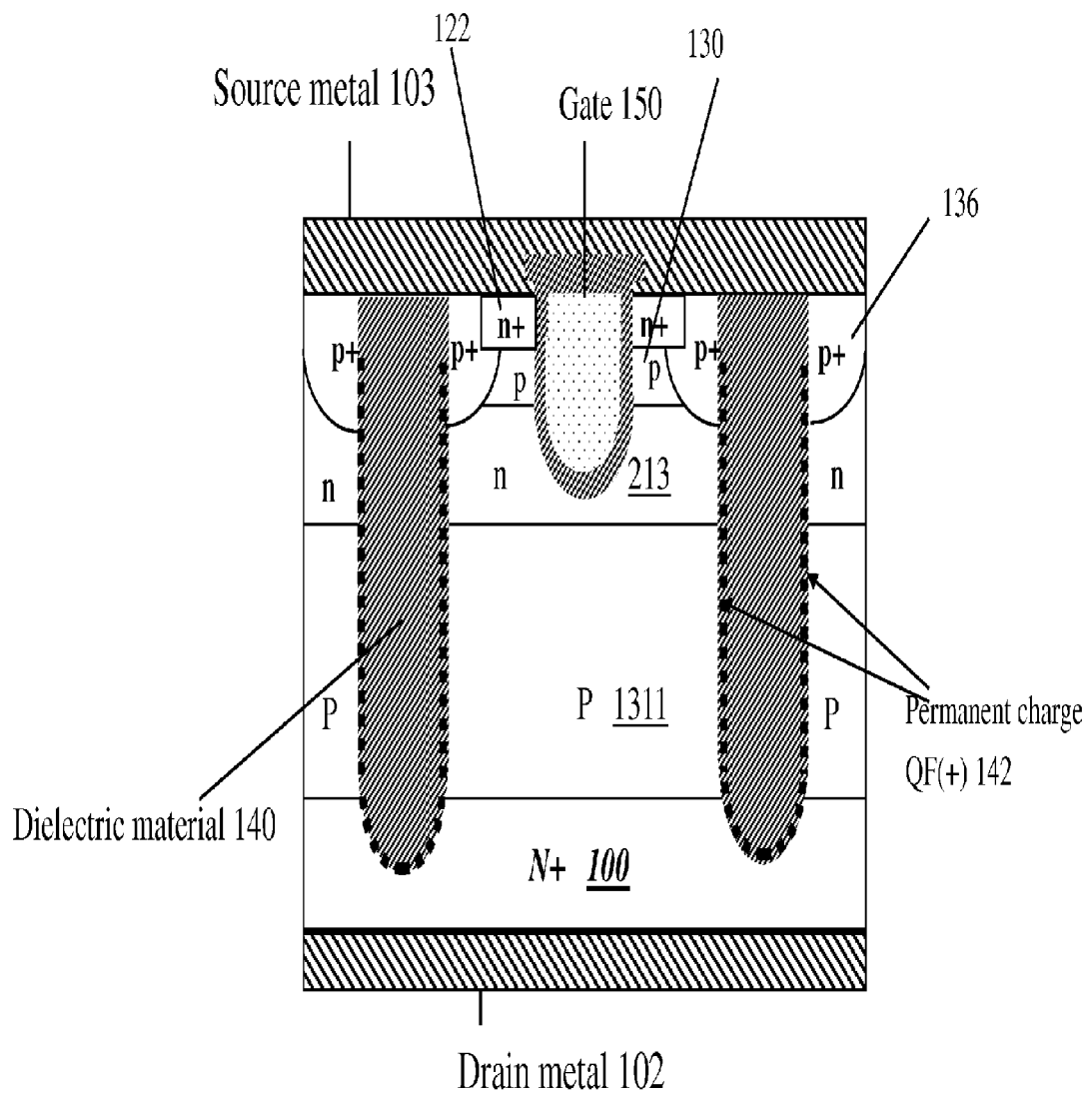
FIG. 13 schematically shows another example of an active device which implements some of the inventive teachings of this application.

FIG. 13 shows a MOS transistor with trenches filled with dielectric material containing permanent charge and the gate electrode in a separate shallower trench. This is an example of an inventive embodiment which includes the npnpn structure of FIG. 1A, including the static inversion of a p-type drift region by immobile net electrostatic charge, but which does NOT include parallel conduction through both n-type and p-type drift regions.

Lateral Devices

FIGS. 14A, 14B, 14C, and 14D, in combination, schematically show an example of a lateral device which implements some of the inventive teachings of this application.

Figure 14A:
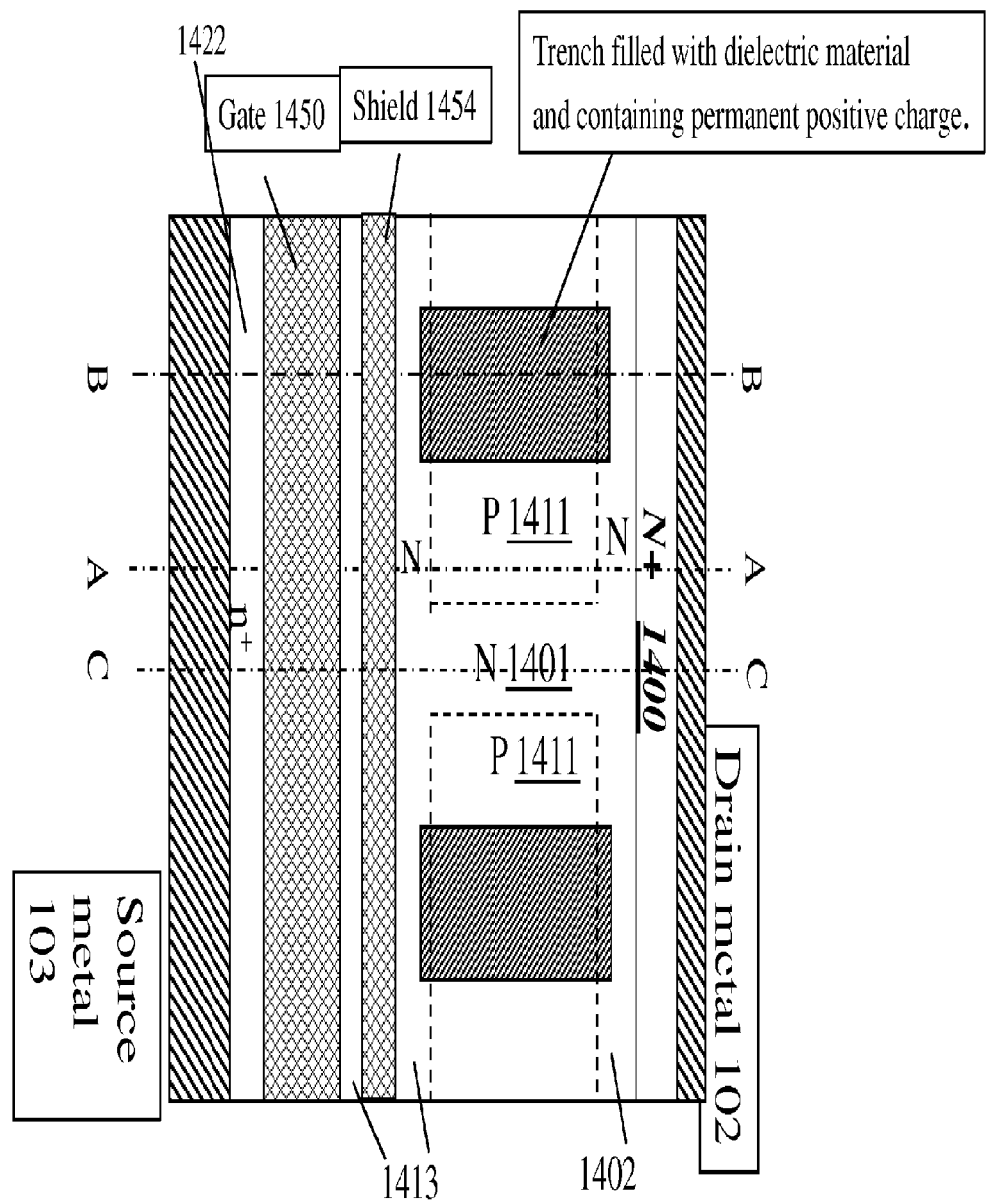

FIG. 14A shows a top view of a new lateral power MOSFET structure with trenches filled with dielectric layer that contain permanent charges.

FIG. 14C shows a section of this device, along line C-C. In this structure, a stepped gate 1450 controls inversion of a p-type body region 1430, to selectively allow conduction. In the ON state, electrons pass from source region 1422 through the inverted portion of body region 1430 (i.e. through the channel), and thence through intermediate region 1413, through n-type drift region 1402, and thence to drain 1400. Note that there is not a junction between the n-type regions 1402 and 1413; preferably 1413 has a higher net doping than 1402, but this is optional. A substrate metallization 1496 provides backside contact to a substrate 1490.

Many, but not all, of the features visible in FIG. 14C are electrically analogous to components of the various vertical device embodiments described above. However, there is more to the device than this.

FIG. 14D shows a section along line BB of this device. Dielectric 1440 blocks conduction in the plane shown. However, dielectric 1440 preferably contains an immobile net electrostatic charge, either in its bulk or at its interfaces (above and below the plane of this drawing).

FIG. 14B shows a section along line AA. Here the p-type drift region portion 1411 is visible. Parts of region 1411 which border the dielectric 1440 will be inverted by the immobile net electrostatic charge in dielectric 1440. The surface dielectric layer 1441 as shown in FIG. 14B can optionally contain an immobile net electrostatic charge which creates a surface electron inversion layer at the interface with the P drift layer 1411. This provides an additional current path from channel to drain and results in a lower $R_{SP}$.

Returning now to the top view of FIG. 14A, it can be seen that the two drift region portions 1411 and 1401 provide paralleled drift regions of opposite types. This helps to improve on-state conductivity. The charge balance resulting from the use of these complementary types also helps improve breakdown.

Process Example

FIGS. 15A-15L show examples of process steps for building various ones of the disclosed device structures.

The starting material can be, for example, an n-on-n+ epitaxial structure, as shown in FIG. 15A.

An n-type implant can now be performed, as shown in FIG. 15B, and then driven in by heat treatment, to form the intermediate layer 213.

The shallow trenches 109 are then etched, and the gate oxide 151 is grown. This results in the structure of FIG. 15C.

The material for the gate electrode 150, e.g. polysilicon, is then deposited and etched back. This results in the structure of FIG. 15D.

The p-type body regions 130 and the n+ source regions 122 are then implanted. This results in the structure of FIG. 15E.

An optional deep P+ region 236 is then implanted and annealed. This results in the structure of FIG. 15F.

Deep trenches 107 are then etched. This results in the structure of FIG. 15G.

The p-type pillars 111 are then formed by lateral growth of in-situ-doped p-type material. (Alternatively, implantation and activation can be used instead.) This results in the structure of FIG. 15H.

An oxide growth step is now performed, to form part of the oxide 144 on the sidewalls of the deep trenches 107. (Note that this growth step is preferably not prolonged enough to fill the trench.) An angle implant is now performed, e.g. of Cs+, to introduce the charged ions which will provide the net electrostatic charge 142. Note that these ions are preferably not dopant ions for the semiconductor material, and most of this implant will not even reach the semiconductor material. This results in the structure of FIG. 15I.

Trench filling can now be completed. This can be done with an oxide growth or deposition step to leave a void in place, or with a polysilicon deposition to form a field plate (as in FIG. 6), or with a slow oxidation to totally fill the trench. This results in the structure of FIG. 15J.

A pad layer of polysilicon is now deposited, and an anneal is performed to activate dopants and densify oxide. This results in the structure of FIG. 15K.

In this example, a recess is now etched for the recessed contact, and source metallization 103 is now deposited. This results in the structure of FIG. 15L.

Examples of IGBT Structures

The disclosed inventions are applicable to a wide variety of device structures. One of these is IGBTs, which have bipolar conduction (i.e. using both electrons and holes).

Figure 16A:
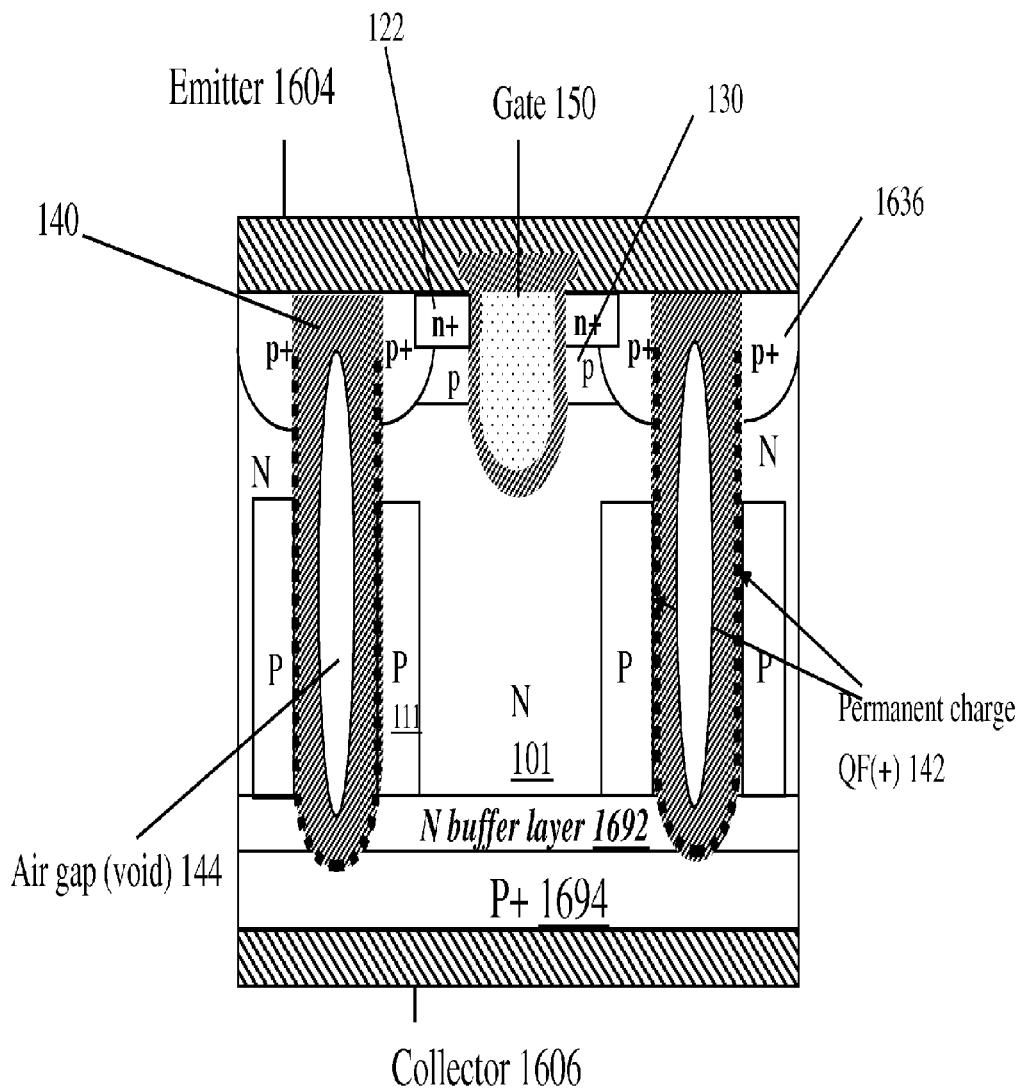
FIGS. 16A and 16B, in combination, schematically show another example of an active device which implements some of the inventive teachings of this application.

FIG. 16A shows an IGBT transistor, in which a P+ diffusion 1694, and an n-type buffer layer 1692, have replaced the N+ drain 100 in the device of FIG. 1A. When the device is off, the combination of p-type pillar 111 with n-type pillar 101 and electrostatic charge 142 improves the breakdown voltage here, just as it does in the device of FIG. 1A.

In the ON state, the P+ diffusion 1694 will act as an emitter for holes. That is, the n-type buffer layer 1692 and the N pillar region 101 will act as the base of a PNP bipolar transistor: electron current which arrives at the junction between regions 1692 and 1694 will cause some emission of holes, which provide another component of current. (Upwardly-flowing holes carry electrical current in the same direction as downwardly-flowing electrons, so the hole current adds to the total conduction of the device.) The hole current results in the conductivity modulation of the N pillar 101 which lowers its resistivity. The hole current can also pass through the p-type pillars 111 and the p+ regions 136 to reach the emitter metallization 1604. This can provide higher latchup current and faster turn-off speed of the device.

Figure 16B:
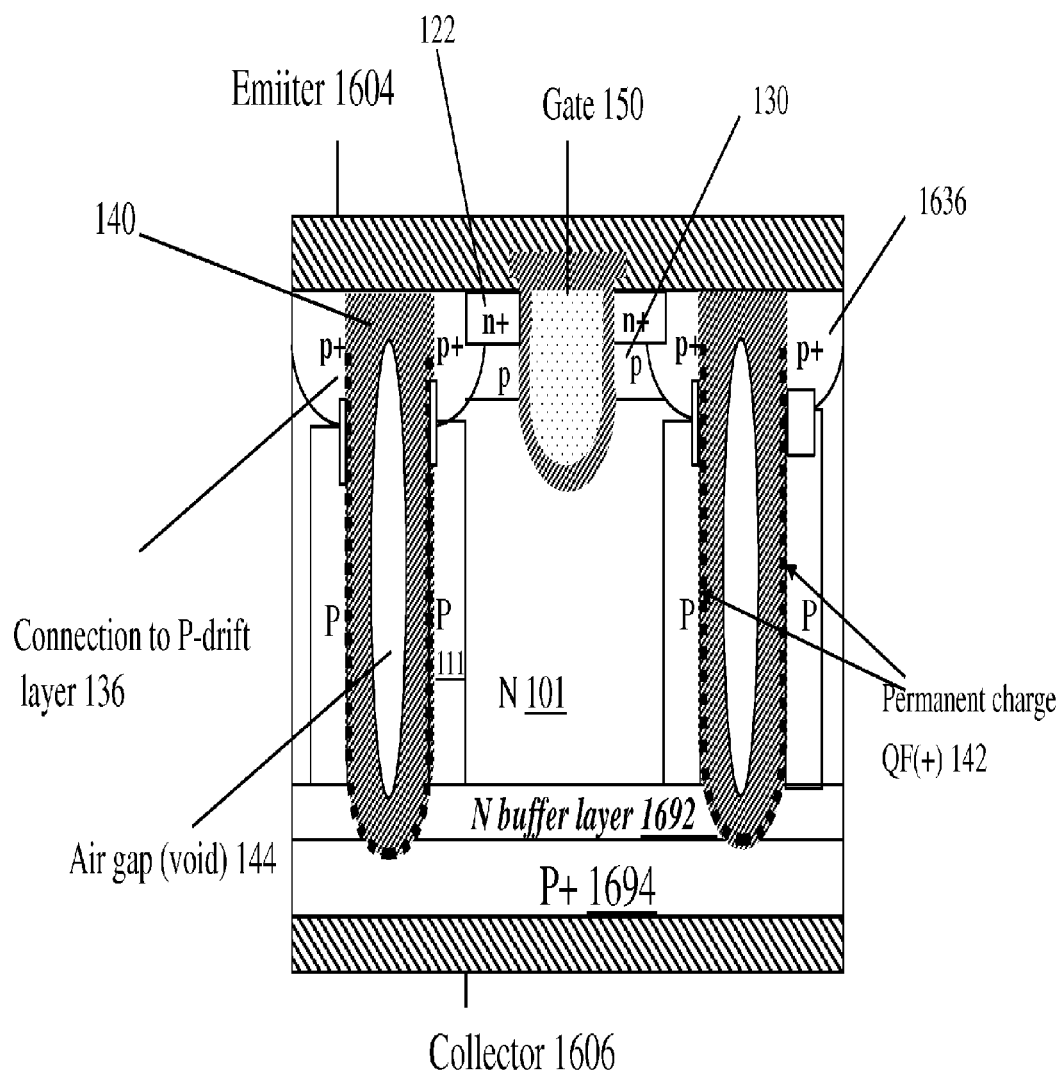

FIG. 16B shows how the p-type pillars extend up to connect with the p+ diffusions at some locations.

Figure 16C:
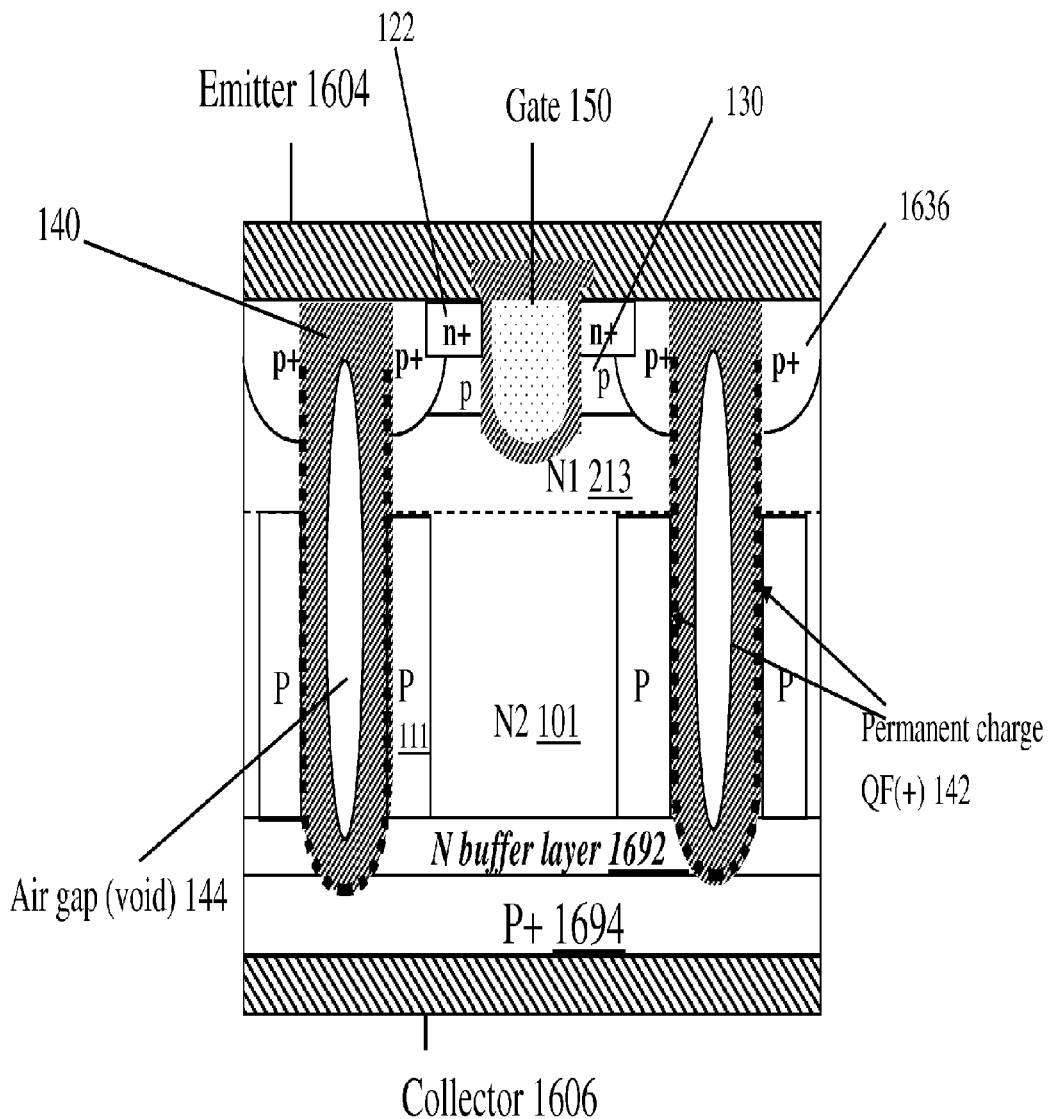
FIG. 16C schematically shows another example of an active device which implements some of the inventive teachings of this application.

FIG. 16C shows an IGBT transistor which is generally similar to that of FIG. 16A, but also includes an intermediate layer 213 where the n-type doping is heavier than in the drift region portion 101. This reduces the on-state series resistance seen by the electron current, while not degrading the on-state series resistance seen by the hole current (which does not pass through region 213).

In the example shown, a void 144 is included in the trench dielectric 140, to reduce parasitic capacitance. However, the trench dielectric 140 can be made solid instead, or can be made from multiple dielectric layers.

This IGBT structure, as compared to a more conventional IGBT, would provide better specific on-resistance, higher latchup current, and faster turn-off.

Figure 17A:
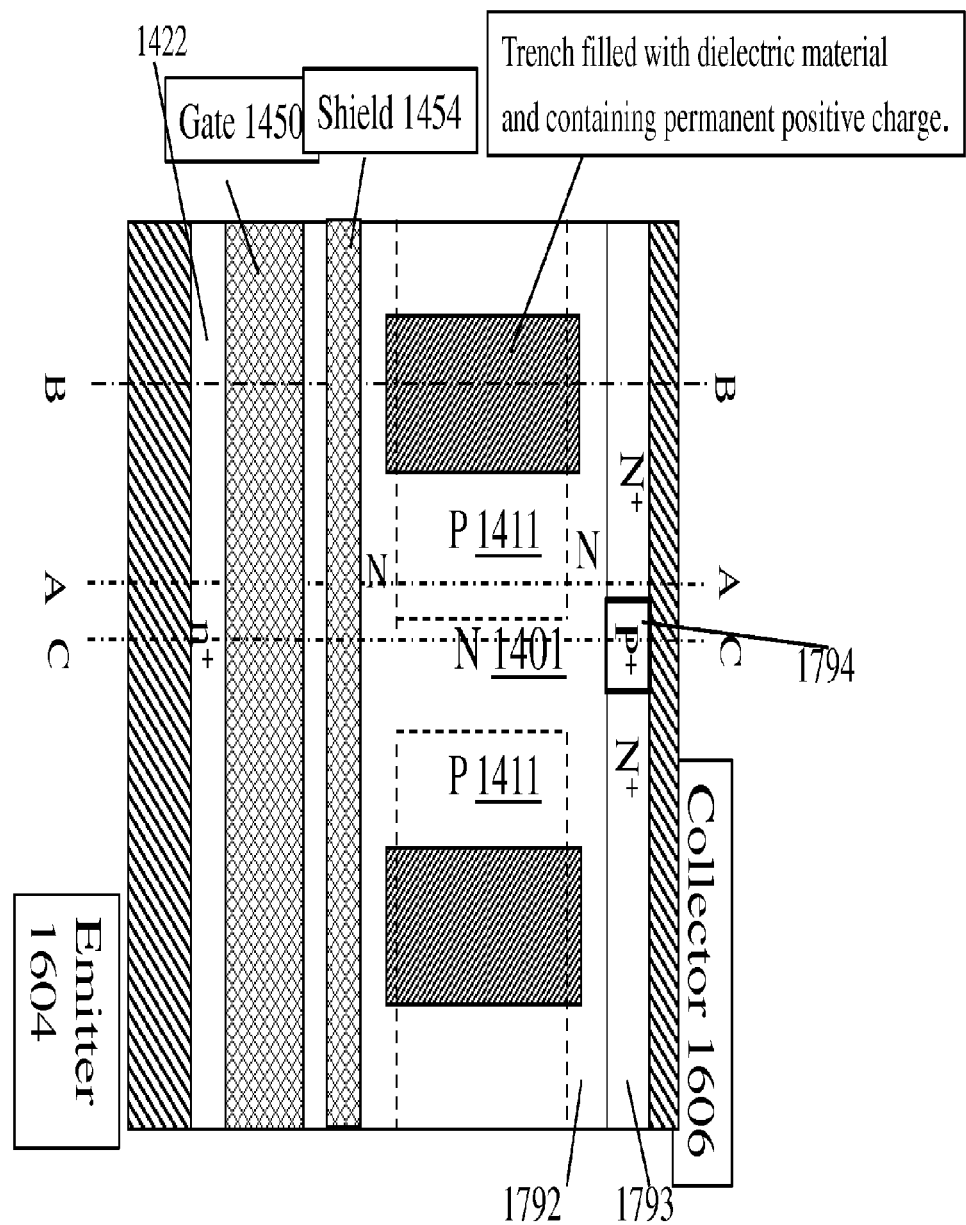

FIGS. 17A-17C, in combination, show a lateral IGBT which incorporates some of the inventive teachings of this application. In many ways the geometry of this device is similar to that of the lateral device of FIGS. 14A-14D, except for the presence of the P+ diffusion 1794 which contacts the collector metallization 1606, and acts as an emitter for holes. An N+ buffer region 1792 and n-type transition region 1793 also help connect the collector metallization 1606 to the current through the drift region.

P+ diffusion 1794 preferably has an electrical connection to the stripes 1411 at some locations, but this is not present at the location shown.

FIG. 17A shows a top view of this device.

FIG. 17B shows a cross section along line AA of the device shown in FIG. 17A.

FIG. 17C shows a cross section along CC of the device shown in FIG. 17A

Single-Trench Embodiment

Figure 18A:
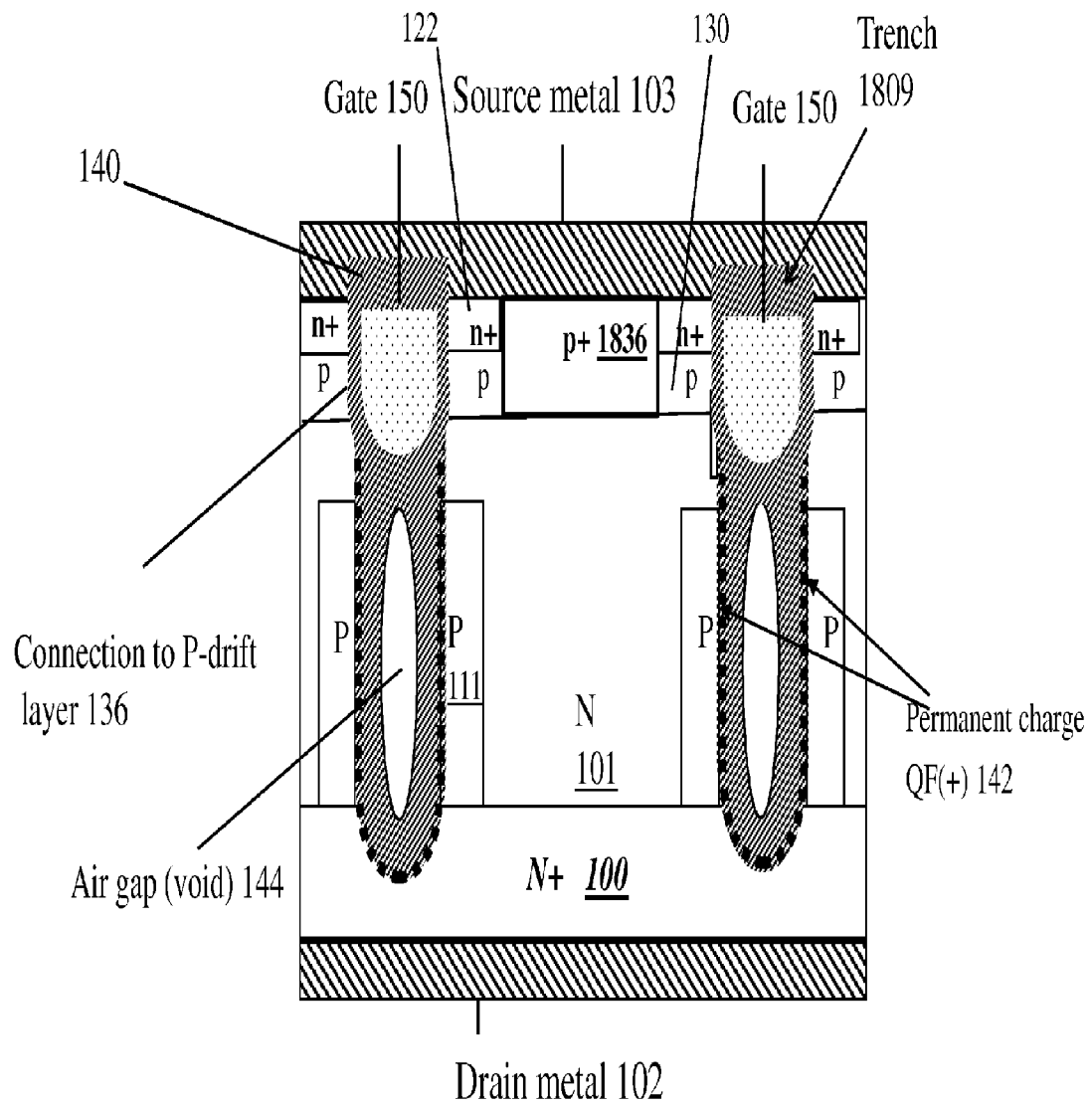
FIGS. 18A and 18B, in combination, schematically show another example of an active device which implements some of the inventive teachings of this application.
Figure 18B:
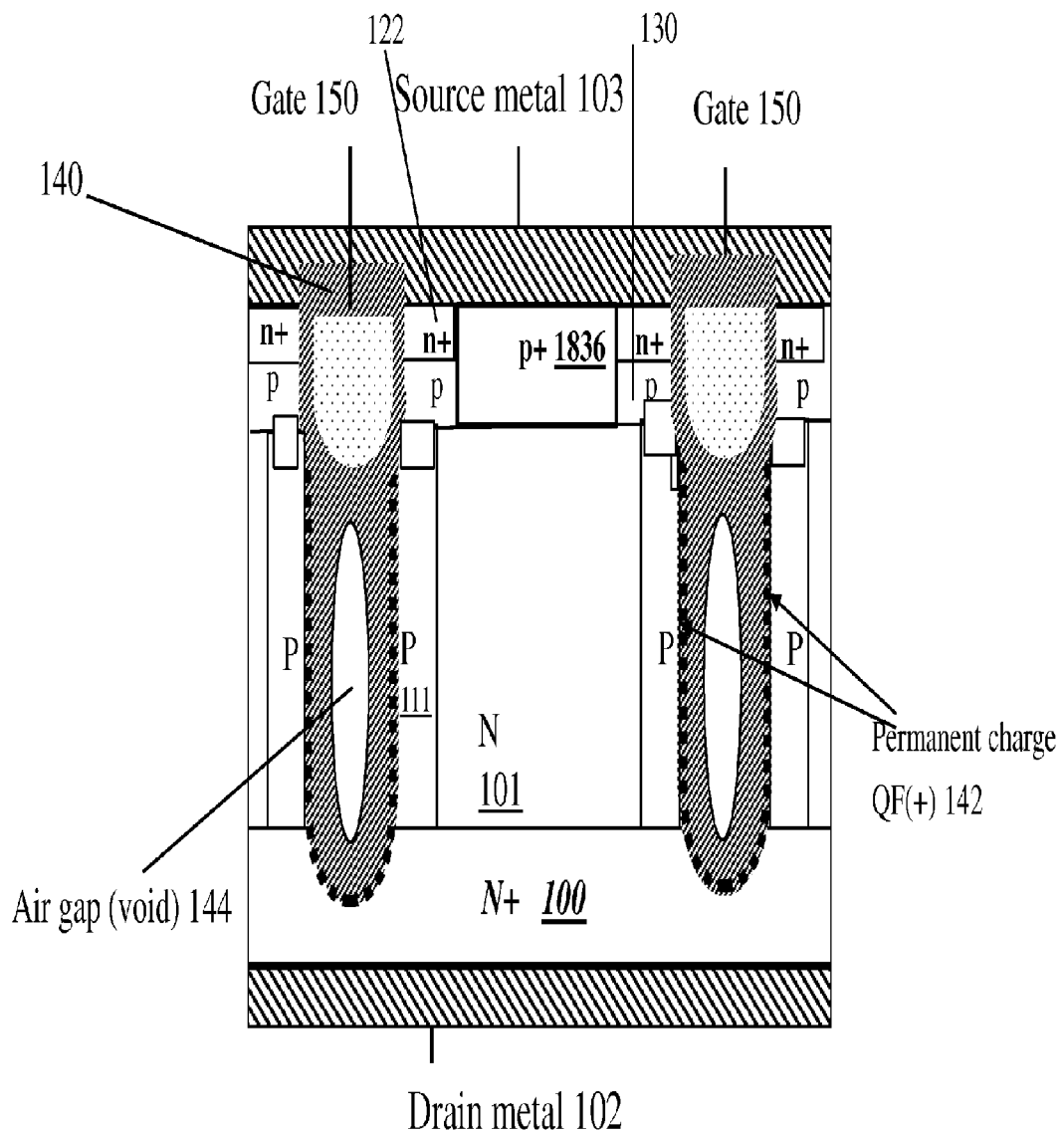

FIGS. 18A and 18B, in combination, show another active device. In these Figures, only one type of trench is used in the active device area, rather than the trenches 107 and 109 used in FIG. 1A.

In this device the gate is located in a deep trench 1809. The trench 1809 includes fixed charge in its dielectric, to invert the portions of p-type pillars 111 which are next to the trench 1809. Since the p-type pillars do merge with the body regions 130 in some locations (as shown in FIG. 18B), and not in other locations (as shown in FIG. 18A), the advantages of paralleled drift region portions are obtained in this structure too.

According to some (but not necessarily all) of the disclosed innovative embodiments, there is provided: A semiconductor device, comprising: a first-conductivity-type semiconductor source region; a second-conductivity-type semiconductor body region; a gate electrode, which is capacitively coupled to invert a portion of said body region; a semiconductor drift region which includes both first-conductivity-type and second-conductivity-type semiconductor portions in parallel; immobile electrostatic charge which is capacitively coupled to invert parts of said second-conductivity-type drift region portions; and a first-conductivity-type semiconductor drain region; wherein said body region is interposed between said source region and said drift region; and wherein said drift region is interposed between said body region and said drain region; and further comprising an intermediate layer which has a first conductivity type, and has a higher doping than said first-conductivity-type semiconductor portion, and which connects said channel to both said first-conductivity-type and said second-conductivity-type semiconductor portions; whereby, in the ON state, majority carriers flow both through said first-conductivity-type portions and said second-conductivity-type portions of said drift region in parallel.

According to some (but not necessarily all) of the disclosed innovative embodiments, there is provided: A semiconductor device, comprising: an n-type semiconductor source region; a p-type semiconductor body region; a gate electrode, which is capacitively coupled to invert a portion of said body region; a semiconductor drift region which includes both n-type and p-type semiconductor portions electrically connected in parallel; immobile positive ions which are capacitively coupled to jointly invert parts of said p-type drift region portions; and an n-type semiconductor drain region; wherein said body region is interposed between said source region and said drift region; and wherein said drift region is interposed between said body region and said drain region; and further comprising an n-type intermediate layer which has a higher doping than said n-type semiconductor portion of said drift region, and which connects said channel to both said first-conductivity-type and said second-conductivity-type semiconductor portions; whereby, in the ON state, electrons flow both through said n-type portions and said p-type portions of said drift region in parallel.

According to some (but not necessarily all) of the disclosed innovative embodiments, there is provided: A semiconductor device, comprising: a first-conductivity-type semiconductor source region; a second-conductivity-type semiconductor body region; a gate electrode, which is capacitively coupled to invert a portion of said body region; a semiconductor drift region which includes both first-conductivity-type and second-conductivity-type semiconductor portions in parallel; immobile electrostatic charge which is capacitively coupled to invert parts of said second-conductivity-type drift region portions; and a first-conductivity-type semiconductor drain region; wherein said body region is interposed between said source region and said drift region; and wherein said drift region is interposed between said body region and said drain region; whereby, in the ON state, majority carriers flow both through said first-conductivity-type portions and said second-conductivity-type portions of said drift region in parallel.

According to some (but not necessarily all) of the disclosed innovative embodiments, there is provided: A semiconductor device, comprising: an n-type semiconductor source region; a p-type semiconductor body region; a gate electrode, which is capacitively coupled to invert a portion of said body region; a semiconductor drift region which includes both n-type and p-type semiconductor portions electrically connected in parallel; immobile positive point charges which are capacitively coupled to jointly invert parts of said p-type drift region portions; and an n-type semiconductor drain region; wherein said body region is interposed between said source region and said drift region; and wherein said drift region is interposed between said body region and said drain region; whereby, in the ON state, electrons flow both through said n-type portions and said p-type portions of said drift region in parallel.

According to some (but not necessarily all) of the disclosed innovative embodiments, there is provided: A semiconductor device, comprising: a first-conductivity-type semiconductor source region; a second-conductivity-type semiconductor body region; a generally planar gate electrode, which is capacitively coupled to invert a portion of said body region to define a predominantly horizontal channel therein; a semiconductor drift region which includes both first-conductivity-type and second-conductivity-type semiconductor pillars in parallel; immobile electrostatic charge which is capacitively coupled to invert parts of said second-conductivity-type drift region portions; and a first-conductivity-type semiconductor drain region; wherein said body region is interposed between said source region and said drift region; and wherein said drift region is interposed between said body region and said drain region; and wherein, in the ON state, majority carriers flow both through said first-conductivity-type and said second-conductivity-type pillars in parallel.

According to some (but not necessarily all) of the disclosed innovative embodiments, there is provided: A semiconductor device, comprising: an n-type semiconductor source region; a p-type semiconductor body region; a planar gate electrode, which is capacitively coupled to invert a portion of said body region to define a predominantly horizontal channel therein; a semiconductor drift region which includes both n-type and p-type semiconductor pillars in parallel; immobile electrostatic charge which is capacitively coupled to invert parts of said p-type drift region portions; and an n-type semiconductor drain region; wherein said body region is interposed between said source region and said drift region; and wherein said drift region is interposed between said body region and said drain region; and wherein, in the ON state, majority carriers flow both through said n-type and said p-type pillars in parallel.

According to some (but not necessarily all) of the disclosed innovative embodiments, there is provided: A semiconductor device, comprising: a first-conductivity-type semiconductor source region; a second-conductivity-type semiconductor body region; a gate electrode, which is capacitively coupled to invert a horizontal portion of said body region; a semiconductor drift region which includes both first-conductivity-type and second-conductivity-type semiconductor stripes in parallel; a trench, containing immobile electrostatic charge which is capacitively coupled to invert parts of said second-conductivity-type stripes; and a first-conductivity-type semiconductor drain region; wherein said body region is interposed between said source region and said drift region; and wherein said first-conductivity-type and second-conductivity-type semiconductor stripes are each laterally interposed between said body region and said drain region; whereby, in the ON state, majority carriers flow both through said first-conductivity-type and said second-conductivity-type stripes in parallel.

According to some (but not necessarily all) of the disclosed innovative embodiments, there is provided: A semiconductor device, comprising: a first-conductivity-type semiconductor source region; a second-conductivity-type semiconductor body region; a gate electrode, which is capacitively coupled to invert a portion of said body region; a semiconductor drift region which includes both first-conductivity-type and second-conductivity-type semiconductor portions in parallel; immobile electrostatic charge which is capacitively coupled to invert parts of said second-conductivity-type drift region portions; a first-conductivity-type semiconductor buffer region; and a second-conductivity-type semiconductor minority-carrier-emitter region; wherein said body region is interposed between said source region and said drift region; and wherein said drift region is interposed between said body region and said drain region; whereby, in the ON state, majority carriers flow both through said first-conductivity-type portions and said second-conductivity-type portions of said drift region in parallel.

According to some (but not necessarily all) of the disclosed innovative embodiments, there is provided: A method of operating a power semiconductor device, comprising: passing majority carriers from a first-conductivity-type semiconductor source, through a portion of a second-conductivity-type semiconductor body region which has been inverted by the applied voltage on a gate electrode, into a first-conductivity-type semiconductor intermediate region; passing some ones of said majority carriers, from said intermediate region, through said first-conductivity-type portions, and passing others of said majority carriers through parts of said second-conductivity-type semiconductor portions which have been inverted by immobile electrostatic charge, to a first-conductivity-type semiconductor drain region; and further comprising an intermediate layer which has a first conductivity type, and has a higher doping than said first-conductivity-type semiconductor portion, and which connects said channel to both said first-conductivity-type and said second-conductivity-type semiconductor portions; whereby, in the ON state, majority carriers flow both through said first-conductivity-type portions and said second-conductivity-type portions of said drift region in parallel.

According to some (but not necessarily all) of the disclosed innovative embodiments, there is provided: A method of operating a power semiconductor device, comprising: passing majority carriers from a first-conductivity-type semiconductor source, through a portion of a second-conductivity-type semiconductor body region which has been inverted by the applied voltage on a gate electrode, into a first-conductivity-type semiconductor intermediate region; passing some ones of said majority carriers, from said intermediate region, through said first-conductivity-type portions, and passing others of said majority carriers through parts of said second-conductivity-type semiconductor portions which have been inverted by immobile electrostatic charge, to a first-conductivity-type semiconductor drain region; and further comprising an intermediate layer which has a first conductivity type, and has a higher doping than said first-conductivity-type semiconductor portion, and which connects said channel to both said first-conductivity-type and said second-conductivity-type semiconductor portions; whereby, in the ON state, majority carriers flow both through said first-conductivity-type portions and said second-conductivity-type portions of said drift region in parallel.

According to some (but not necessarily all) of the disclosed innovative embodiments, there is provided: A method of operating a power semiconductor device, comprising, in the ON state: passing majority carriers from a first-conductivity-type semiconductor source, through a portion of a second-conductivity-type semiconductor body region which has been inverted by the applied voltage on a gate electrode, into a semiconductor drift region which includes both first-conductivity-type and second-conductivity-type semiconductor portions in parallel; and passing some ones of said majority carriers through said first-conductivity-type portions, and passing others of said majority carriers through parts of said second-conductivity-type semiconductor portions which have been inverted by immobile electrostatic charge, to a first-conductivity-type semiconductor drain region.

According to some (but not necessarily all) of the disclosed innovative embodiments, there is provided: A method of operating a power semiconductor device, comprising, in the ON state: passing majority carriers from a first-conductivity-type semiconductor source, through a portion of a second-conductivity-type semiconductor body region which has been inverted by the applied voltage on a gate electrode, into a semiconductor drift region which includes both first-conductivity-type and second-conductivity-type semiconductor portions in parallel; and passing some ones of said majority carriers through said first-conductivity-type portions, and passing others of said majority carriers through parts of said second-conductivity-type semiconductor portions which have been inverted by immobile electrostatic charge, through a first-conductivity-type semiconductor buffer region, to a second-conductivity-type minority-carrier-emitter region; and passing minority carriers from said minority-carrier-emitter region through parts of said second-conductivity-type semiconductor portions which have not been inverted, and through additional second-conductivity-type regions, to a contact which is also electrically connected to said source region.

According to some (but not necessarily all) of the disclosed innovative embodiments, there is provided: Power semiconductor devices, and related methods, where majority carrier flow is divided into paralleled flows through two drift regions of opposite conductivity types.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For one example, the examples described above are generally n-channel devices, in which electrons are the majority carriers; but the disclosed innovations can also be applied to p-channel devices, in which holes are the majority carriers.

For another example, the examples described above are implemented in silicon; but in alternative embodiments, the disclosed innovations can also be implemented in other semiconductors such Ge, SiGe, GaAs or other III-V compound semiconductors (including ternary and quaternary alloys), SiC or other Group IV semiconducting alloys, etc. etc.

In other contemplated embodiments, various doped regions can have graded dopant concentrations.

In various other embodiments, a wide variety of other semiconductor regions and connections can be added if desired.

In various other embodiments, a wide variety of other semiconductor regions and connections can be added if desired.

The two IGBT embodiments described in detail above are merely examples of the many possible structures which include at least some degree of bipolar conduction.

Additional general background, which helps to show variations and implementations, as well as some features which can be synergistically with the inventions claimed below, may be found in the following U.S. patent applications. All of these applications have at least some common ownership, copendency, and inventorship with the present application: All of these applications, and all of their priority applications, are hereby incorporated by reference: US20080073707; US20080191307; US20080164516; US20080164518; US20080164520; US20080166845; US20090206924; US20090206913; US20090294892; US20090309156; US20100013552; US20100025726; US20100025763; US20100084704; US20100219462; US20100219468; US20100214016; US20100308400; US20100327344; US20110006361; US20110039384; US20110079843; and U.S. application Ser. Nos. 12/369,385; 12/431,852; 12/720,856; 12/806,203; 12/834,573; 12/835,636; 12/887,303; 12/939,154; 13/004,054; and 13/089,326. Applicants reserve the right to claim priority from these applications, directly or indirectly, and therethrough to even earlier applications, in all countries where such priority can be claimed.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device, comprising:
a first-conductivity-type semiconductor source region;
a second-conductivity-type semiconductor body region;
a gate electrode, which is capacitively coupled to invert a horizontal portion of said body region;
a semiconductor drift region which includes both first-conductivity-type and second-conductivity-type semiconductor stripes in parallel;
a trench, containing immobile electrostatic charge which is capacitively coupled to invert parts of said second-conductivity-type stripes; and
a first-conductivity-type semiconductor drain region;
wherein said body region is interposed between said source region and said drift region;
and wherein said first-conductivity-type and second-conductivity-type semiconductor stripes are each laterally interposed between said body region and said drain region;
whereby, in the ON state, majority carriers flow both through said first-conductivity-type and said second-conductivity-type stripes in parallel.

2. The device of claim 1, wherein said first-conductivity-type source region is n-type, and said majority carriers are electrons.

3. The device of claim 1, wherein said source, body, drain and drift regions are silicon.

4. The device of claim 1, wherein said immobile electrostatic charge laterally adjoins said second-conductivity-type stripes.

5. The device of claim 1, wherein said immobile electrostatic charge both overlies and laterally adjoins said second-conductivity-type stripes.

6. The device of claim 1, wherein said immobile electrostatic charge is provided by cesium ions.

7. The device of claim 1, wherein said immobile electrostatic charge consists of point charges.

8. The device of claim 1, wherein said immobile electrostatic charge is provided by ions in dielectric material and/or by ions at a dielectric/semiconductor interface.

9. The device of claim 1, wherein said immobile electrostatic charge is provided by ions in dielectric material in a trench.

10. A semiconductor device, comprising:
a first-conductivity-type semiconductor source region;
a second-conductivity-type semiconductor body region;
a gate electrode, which is capacitively coupled to invert a portion of said body region;
a semiconductor drift region which includes both first-conductivity-type and second-conductivity-type semiconductor portions in parallel;

immobile electrostatic charge which is capacitively coupled to invert parts of said second-conductivity-type drift region portions;
a first-conductivity-type semiconductor buffer region; and
a second-conductivity-type semiconductor minority-carrier-emitter region;
wherein said body region is interposed between said source region and said drift region;
and wherein said drift region is interposed between said body region and said drain region;
whereby, in the ON state, majority carriers flow both through said first-conductivity-type portions and said second-conductivity-type portions of said drift region in parallel.

11. The device of claim 10, wherein said immobile electrostatic charge is provided by cesium ions.

12. The device of claim 10, wherein said first-conductivity-type source region is n-type, and said majority carriers are electrons.

13. The device of claim 10, wherein said source, body, drain and drift regions are silicon.

14. The device of claim 10, wherein said immobile electrostatic charge consists of point charges.

15. The device of claim 10, wherein said immobile electrostatic charge is provided by ions in dielectric material and/or by ions at a dielectric/semiconductor interface.

16. The device of claim 10, wherein said immobile electrostatic charge is provided by ions in dielectric material in a trench.

17. The device of claim 10, wherein said second-conductivity-type portions have inhomogeneous doping, such that less heavily doped portions thereof are inverted by said immobile electrostatic charge.

18. A semiconductor device, comprising:
a first-conductivity-type semiconductor source region;
a second-conductivity-type semiconductor body region;
a gate electrode, which is capacitively coupled to invert a horizontal portion of said body region;
a semiconductor drift region which includes both first-conductivity-type and second-conductivity-type semiconductor stripes in parallel;
a trench, containing immobile electrostatic charge which is capacitively coupled to invert parts of said second-conductivity-type stripes; and
a first-conductivity-type semiconductor drain region;
wherein said body region is interposed between said source region and said drift region;
and wherein said first-conductivity-type and second-conductivity-type semiconductor stripes are each laterally interposed between said body region and said drain region;
whereby, in the ON state, majority carriers flow both through said first-conductivity-type and said second-conductivity-type stripes in parallel;
wherein said second-conductivity-type stripes have inhomogeneous doping, such that less heavily doped portions thereof are inverted by said immobile electrostatic charge.

\* \* \* \* \*